United States Patent [19]
Koike et al.

[11] Patent Number: 6,096,390
[45] Date of Patent: *Aug. 1, 2000

[54] METHOD OF FORMING A HARD CARBON FILM OVER THE INNER SURFACE OF A GUIDE BUSH

[75] Inventors: Ryota Koike, Tokorozawa; Yukio Miya, Kawagoe; Osamu Sugiyama, Tokorozawa; Takashi Toida, Tokyo; Toshiichi Sekine, Kamifukuoka, all of Japan

[73] Assignee: Citizen Watch Co., Ltd., Tokyo, Japan

[*] Notice: This patent is subject to a terminal disclaimer.

[21] Appl. No.: 09/260,487

[22] Filed: Mar. 2, 1999

Related U.S. Application Data

[62] Division of application No. 08/912,923, Aug. 15, 1997, Pat. No. 5,941,647.

[30] Foreign Application Priority Data

Aug. 19, 1996 [JP] Japan ................................. 8-217353

[51] Int. Cl.[7] ............................. H05H 1/24; C23C 16/26
[52] U.S. Cl. ...................... 427/577; 427/237; 427/249.7
[58] Field of Search ................................... 427/577, 237, 427/238, 239, 249.7

[56] References Cited

U.S. PATENT DOCUMENTS

| 5,879,763 | 3/1999 | Sugiyama et al. ...................... 427/577 |
| 5,922,418 | 7/1999 | Koike et al. ............................ 427/577 |
| 5,939,152 | 8/1999 | Sugiyama et al. ...................... 427/577 |

FOREIGN PATENT DOCUMENTS 4-141303  5/1992  Japan .

*Primary Examiner*—Shrive Beck
*Assistant Examiner*—Bret Chen
*Attorney, Agent, or Firm*—Armstrong, Westerman, Hattori, McLeland & Naughton

[57] ABSTRACT

A hard carbon film is formed over an inner surface of a guide bush by the steps of disposing the guide bush in a vacuum vessel, inserting an electrode into a center bore of the guide bush and applying a positive current to the electrode, introducing a gas, containing carbon, through a gas inlet port into the vacuum chamber after evacuating the vacuum vessel, and producing a plasma in the vacuum vessel to form a hard carbon film of hydrogenated amorphous carbon over the inner surface of the guide bush by a plasma CVD method.

16 Claims, 14 Drawing Sheets

METHOD OF FORMING A HARD CARBON FILM OVER THE INNER SURFACE OF A GUIDE BUSH

This application is a division of prior application Ser. No. 08/912,923 filed Aug. 15, 1997.

BACKGROUND OF THE INVENTION

1. Field of the Invention

The present invention relates to a guide bush mounted on an automatic lathe to support a rodlike workpiece for rotation and axial sliding at a position near a cutting tool (cutter), and a method of forming a hard carbon film over the inner surface of the guide bush to be in sliding contact with the workpiece.

2. Description of the Related Art

Guide bushes mounted on the column of an automatic lathe to hold a rodlike workpiece for rotation at a position near a cutting tool are classified into rotary guide bushes and stationary guide bushes. A rotary guide bush rotates together with a workpiece and holds the workpiece for axial sliding. A stationary guide bush remains stationary and holds a workpiece for rotation and axial sliding.

A guide bush of either type has a portion having a tapered outer surface provided with slits to make the same portion elastic, a threaded portion to hold the guide bush on the column, and an inner surface for holding a workpiece. The inner surface always in sliding contact with a workpiece is liable to be worn and, particularly, the inner surface of a stationary guide bush is worn rapidly.

A guide bush proposed in JP-A No. 4-141303 has an inner surface to be in sliding contact with a workpiece, which slides and rotates on the inner surface, attached with a cemented carbide (superhard alloy sleeve) or a ceramic material attached to the inner surface by brazing or the like.

When the inner surface of a guide bush is attached with a cemented carbide or a ceramic material excellent in intensity and heat resistance, the wear of the inner surface of the guide bush can be reduced to some extent.

However, when the workpiece is subjected to heavy machining on an automatic lathe, in which the depth of cut is large and the cutting speed is high, the workpiece is damaged or seizing occurs due to decrease in the diametrical clearance between the guide bush and the workpiece even if the inner surface of the guide bush is attached with a cemented carbide or a ceramic material, because the cemented carbide and the ceramic material have comparatively a large coefficient of friction and a low thermal conductivity. Therefore, it has been difficult to increase the depth of cut and cutting speed.

The stationary guide bush has advantages that a workpiece can be accurately machined in a high roundness because the workpiece can be held so that its axis may not run out, less noise is generated, the automatic lathe may be of a simple, compact construction.

However, the inner surface of the stationary guide bush is worn far more rapidly than that of the rotary guide bush and hence it is more difficult to increase depth of cut and cutting speed when the stationary guide bush is employed.

Accordingly, it is an object of the present invention to provide a guide bush capable of solving such problems, having an inner surface to be in contact with a workpiece, having improved wear resistance, and capable of enabling an automatic lathe to machine a workpiece at an increased depth of cut and an increased cutting speed without damaging the workpiece or causing seizure between the guide bush and the workpiece. Another object of the present invention is to provide a method of efficiently manufacturing such a guide bush.

SUMMARY OF THE INVENTION

Therefore, the guide bush according to the present invention is formed substantially in a cylindrical shape and has a center bore in its axial direction, and further includes a tapered outer surface, an inner surface to be in sliding contact with a workpiece and slits provided at one end thereof, and it holds the workpiece inserted into the center bore rotatably and slidably in the axial direction near a cutting tool when the guide bush is mounted on an automatic lathe, wherein the inner surface which is in sliding contact with the workpiece is coated with a hard carbon film in a manner such that a thickness of the hard carbon at a portion near the open end of the guide bush is greater than that at the inner portion.

The hard carbon film is formed of a hydrogenated amorphous carbon closely resembling diamond in properties. Therefore, hydrogenated amorphous carbon is also called diamondlike carbon (DLC).

The hard carbon film (DLC film) has a high hardness (not lower than Vickers 3000 Hv), is excellent in wear resistance and corrosion resistance, and has a small coefficient of friction (about ⅛ that of a cemented carbide).

The guide bush of the present invention having an inner surface to be in sliding contact with a workpiece, coated with the hard carbon film, has wear resistance more excellent than the conventional guide bush having an inner surface attached with a cemented carbide or a ceramic material.

Accordingly, an automatic lathe employing the stationary guide bush of the present invention is able to achieve heavy machining, in which depth of cut is large and cutting speed is high, with high accuracy for an extended period of time without damaging the workpiece and causing seizure.

Further, since the hard carbon film is formed in such a manner that a thickness of the hard carbon at the portion near the open end of the inner surface, where frequent sliding contact of the inner surface of the guide bush with the workpiece occurs and the hard carbon is worn strongly, is greater than that at the inner portion (portion remote from the open end), wear resistance can be further enhanced.

If a hard carbon film is formed on an intermediate layer formed over the inner surface of the guide bush to enhance the adhesion or is formed on a superhard lining such as a superhard alloy or ceramic and the intermediate layer is formed over the inner surface of the guide bush, the durability can be further enhanced.

A method of forming a hard carbon film over the inner surface of a guide bush in accordance with the present invention comprises the following steps.

A guide bush on which the hard carbon film is not yet formed is placed in a vacuum vessel provided with a gas inlet port and an evacuation port, and a rodlike auxiliary electrode provided with a stepped portion having an extremity which is smaller than another portion is inserted into the center bore forming the inner surface of the guide bush in such a manner that the extremity is positioned near the open end of the inner surface of the guide bush which is to be in sliding contact with the workpiece, thereby maintaining the auxiliary electrode at a ground potential.

A gas containing carbon is introduced through the gas inlet port into the vacuum vessel to produce a plasma therein after the vacuum vessel is evacuated, and a hard carbon film of hydrogenated amorphous carbon is formed over the inner surface of the guide bush by the plasma CVD method (plasma chemical vapor deposition process).

Thus, a hard carbon film is formed firmly over the inner surface of the guide bush which is to be in sliding contact with the workpiece in a manner that the film thickness near the open end is greater than that at the inner portion.

As for the auxiliary electrode, a rodlike auxiliary electrode provided with a tapered part at the end may be inserted into the center bore so as to position the end of the tapered part near the open end of the inner surface of the guide bush.

Further, a DC positive voltage may be applied to these electrodes instead of maintaining them at the ground potential.

In order to produce a plasma in the vacuum vessel, there is a method of producing a plasma by providing an anode and a filament in the vacuum vessel, applying a DC voltage to the guide bush, applying a DC voltage to the anode and applying an AC voltage to the filament.

There is another method of producing a plasma by applying radio frequency power or a DC voltage to the guide bush without providing an anode or a filament in the vacuum vessel.

The above and other objects, features and advantages of the invention will be apparent from the following detailed description which is to be read in conjunction with the accompanying drawings.

BEST MODE FOR CARRYING OUT THE INVENTION

Automatic Lathe Employing Guide Bush in Accordance with the Present Invention

The construction of an automatic lathe employing a guide bush in accordance with the present invention will be briefly described.

Figure 22:
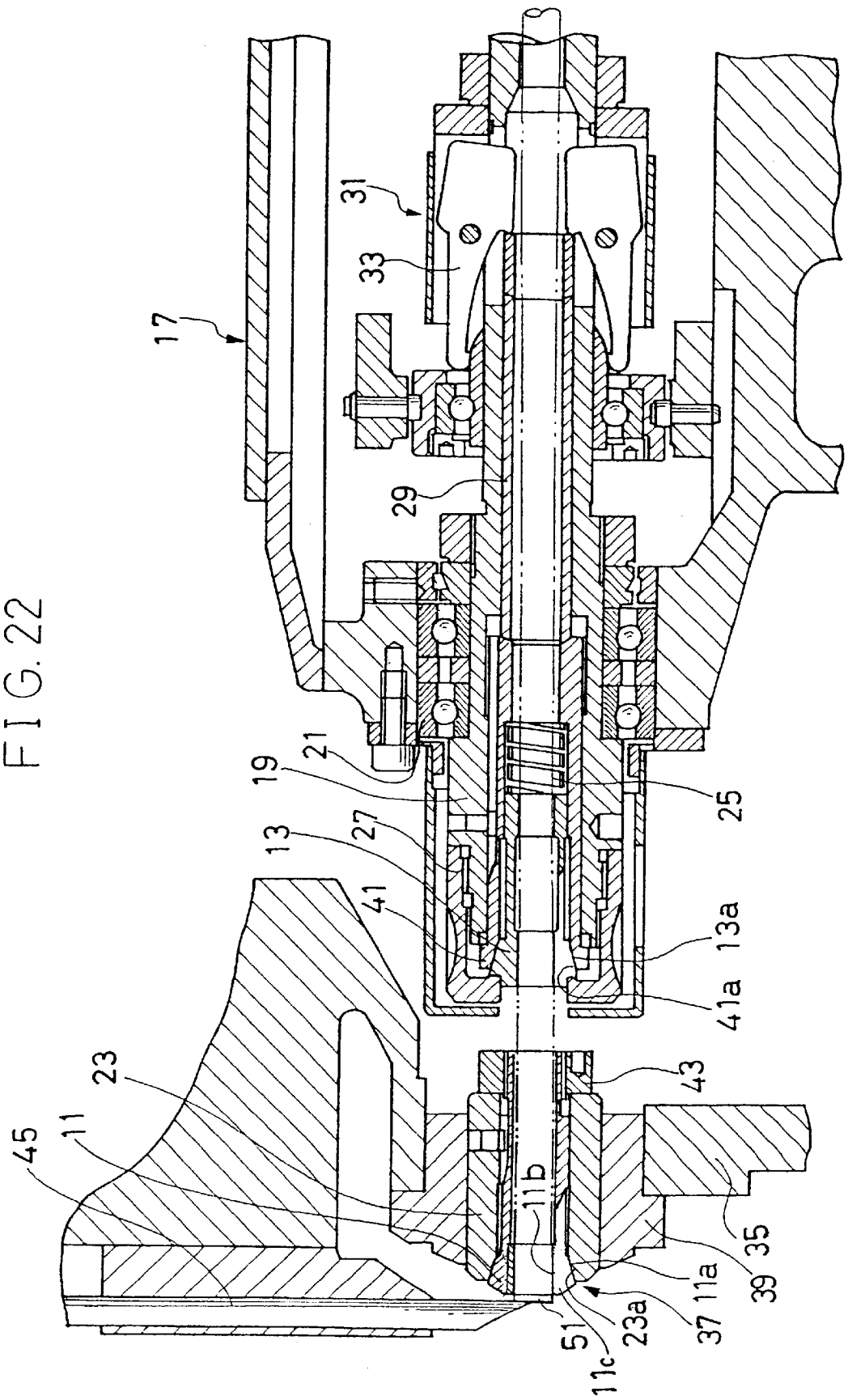
FIG. 22 is a sectional view of a spindle and associated parts included in an automatic lathe provided with a rotary guide bush unit employing a guide bush in accordance with the present invention.

Referring to FIG. 22 showing only a spindle and associated parts of a numerically controlled automatic lathe in a sectional view. The automatic lathe is provided with a stationary guide bush unit 37 that holds a guide bush 11 fixedly to support a workpiece 51 (indicated by imaginary lines) rotatably on the inner surface 11b of the guide bush 11.

A spindle stock 17 is mounted on the bed, not shown, of the numerically controlled automatic lathe for sliding movement in transverse directions, as viewed in the figure.

A spindle 19 is supported for rotation in bearings 21 on the spindle stock 17, and a collet chuck 13 is mounted on the nose of the spindle 19.

The collet chuck 13 having a coned head having a tapered outer surface 13a is inserted in the center bore of a chucking sleeve 41 with the tapered outer surface 13a in close contact with a tapered inner surface 41a formed in a front portion of the chucking sleeve 41.

A coil spring 25 formed by winding a spring band is inserted in an intermediate sleeve 29 at the back end of the collet chuck 13. The collet chuck 13 can be pushed out of the intermediate sleeve 29 by the action of the coil spring 25.

The position of the front end of the collet chuck 13 is determined by a cap nut 27 fastened to the front end of the spindle 19 with screws and in contact with the front end of the collet chuck 13. The cap nut 27 restrains the collet chuck 13 from being pushed out of the intermediate sleeve 29 by the force of the coil spring 25.

A chuck operating mechanism 31 provided with chuck operating levers 33 is provided on the back end of the intermediate sleeve 29. The chuck operating levers 33 are operated to open or close the collet chuck 13 so that the collet chuck 13 releases or chucks the workpiece 51.

When the chuck operating levers 33 of chuck operating mechanism 31 are turned so that the front ends thereof are moved away from each other, operating portions of the chuck operating levers 33 in contact with the intermediate sleeve 29 move to the left, as viewed in FIG. 22 to push the intermediate sleeve 29 to the left. Consequently, the chucking sleeve 41 in contact with the left end of the intermediate sleeve 29 moves to the left.

The collet chuck 13 is restrained from being pushed out of the spindle 19 by the cap nut 27 fastened to the front end of the spindle 19 with screws.

Therefore, when the chucking sleeve 41 is moved to the left, the tapered inner surface 41a of the chucking sleeve 41 is pressed against the tapered outer surface 13a of the slitted, coned head portion of the collet chuck 13 and the taper inner surface 41a of the chucking sleeve 41 moves to the left along the taper outer surface 13a of the collet chuck 13.

Consequently, collet chuck 13 is compressed and the inside diameter of the collet chuck 13 is reduced to grip the workpiece 51.

When releasing the workpiece 51 from the collet chuck 13 by expanding the collet chuck 13 so that the inside diameter of the collet chuck 13 is increased, the chuck operating levers 33 are turned so that the front ends thereof are moved toward each other to remove the force acting to the left on the chucking sleeve 41.

Then, the intermediate sleeve 29 and the chucking sleeve 41 are moved to the right as viewed in FIG. 22 by the stored energy of the coil spring 25.

Consequently, the pressure applied to the tapered outer surface 13a of the collet chuck 13 by the tapered inner surface 41a of the chucking sleeve 41 is removed to allow the collet chuck 13 to expand by its own resilience, so that the inside diameter of the collet chuck 13 increases to release the workpiece 51.

A column 35 is disposed in front of the spindle stock 17 and the guide bush unit 37 is placed on the column 35 with its center axis aligned with that of the spindle.

The guide bush unit 37 is of a stationary type fixedly holding the guide bush 11 to support the workpiece 51 rotatably on the inner surface 11b of the guide bush 11.

A bush sleeve 23 is fitted in the center bore of a holder 39 fixed to the column 35. A tapered inner surface 23a is formed in the front portion of the bush sleeve 23.

The guide bush 11 having a front portion provided with a tapered outer surface 11a and slits 11c are fitted in the center bore of the bush sleeve 23.

The clearance between the inner surface of the guide bush 11 and the outer surface of the workpiece 51 can be adjusted by turning an adjusting nut 43 screwed on the threaded portion of the guide bush 11 and contiguous with the back end of the guide bush unit 37.

When the adjusting nut 43 is turned clockwise, the guide bush 11 moves to the right, as viewed in FIG. 22, relative to the bush sleeve 23 and the tapered outer surface 11a of the guide bush 11, similarly to the tapered outer surface of the collet chuck 13, is compressed by the tapered inner surface 23a of the bush sleeve 23 and the inside diameter of the slitted front portion of the guide bush 11 is reduced.

A cutting tool (cutter) 45 is disposed in further front of the guide bush unit 37.

The workpiece 51 is chucked by the collet chuck 13 mounted on the spindle 19 and supported by the guide bush unit 37. A portion of the workpiece 51 projecting from the guide bush unit 37 into a machining region is machined for predetermined machining by a combined motion of the cross feed motion of the cutting tool 45 and the longitudinal traverse motion of the spindle stock 17.

Figure 23:
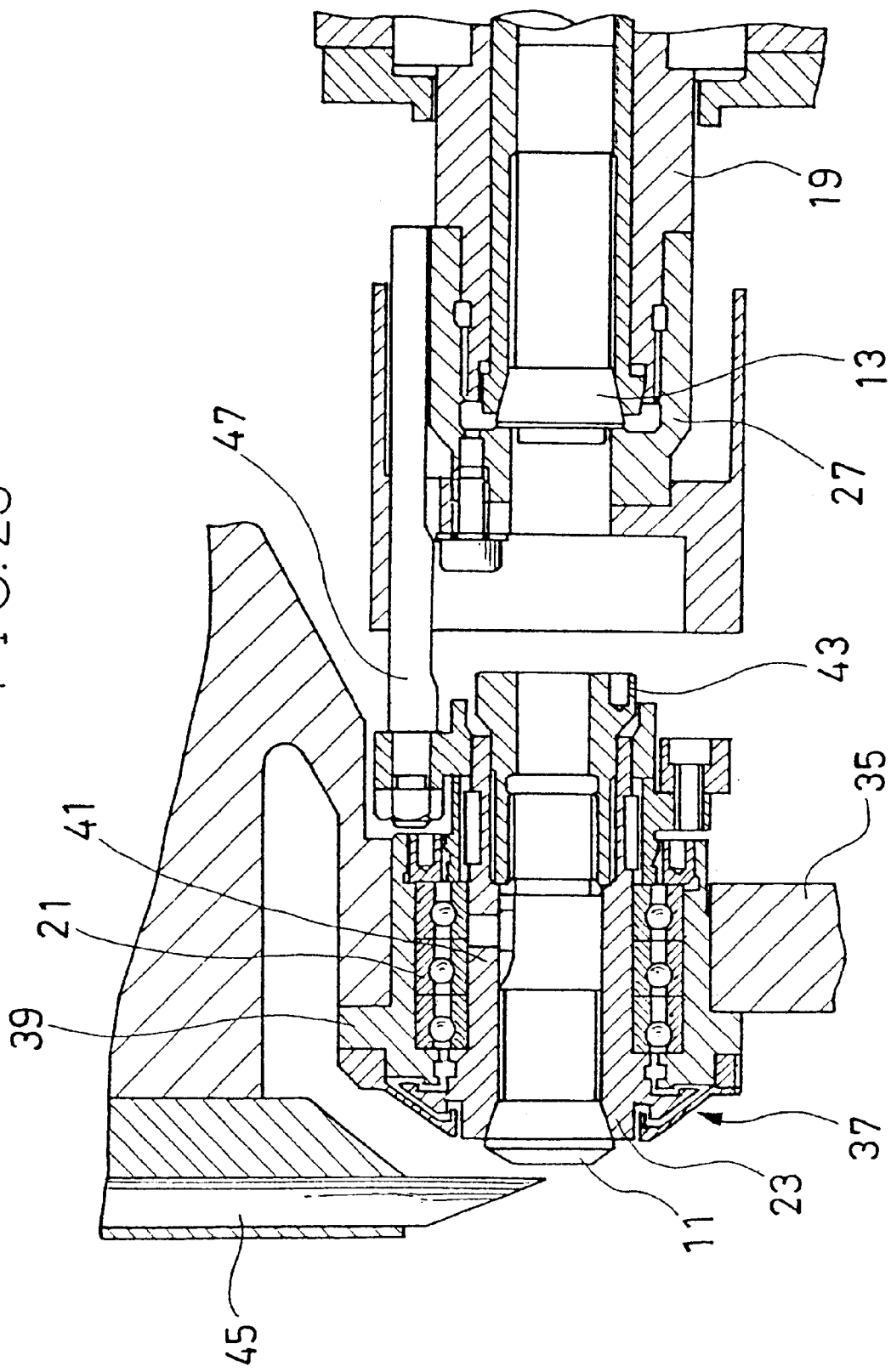
FIG. 23 is a sectional view of a spindle and associated parts included in an automatic lathe provided with a rotary guide bush unit employing a guide bush in accordance with the present invention.

A rotary guide bush unit that supports rotatably a guide bush gripping a workpiece will be described with reference to FIG. 23, in which parts like or corresponding to those shown in FIG. 22 are designated by the same reference characters.

Rotary guide bush units are classified into those holding a guide bush 11 so as to rotate in synchronism with the collet chuck 13 and those holding a guide bush 11 so as to rotate in asynchronism with the collet chuck 13. A guide bush unit 37 shown in FIG. 23 holds the guide bush 11 so as to rotate in synchronism with the collet chuck 13.

The rotary guide bush unit 37 is driven by a drive rod 47 projecting from the cap nut 27 mounted on the spindle 19. A gear mechanism or a belt-and-pulley mechanism may be used instead of the drive rod 47 for driving the guide bush unit 37.

The rotary guide bush unit 37 has a holder 39 fixed to a column 35. A bush sleeve 23 is inserted in the center bore of the holder 39 and is supported in bearings 21 on the holder 39, and the guide bush 11 is fitted in the center bore of the bush sleeve 23.

The bush sleeve 23 and the guide bush 11 are similar in construction to those illustrated in FIG. 22, respectively. The clearance between the inner surface of the guide bush 11 and the outer surface of the workpiece 51 can be adjusted by turning an adjusting nut 43 screwed on the threaded portion of the guide bush 11 which is contiguous with the back end of the guide bush unit 37.

This automatic lathe is the same in construction as the automatic lathe illustrated in FIG. 22 except that this automatic lathe is provided with the rotary guide bush unit 37, and hence the further description thereof will be omitted.

Guide Bush In Accordance with the Present Invention

Guide bushes in preferred embodiments according to the present invention will be described hereinafter.

Figure 1:
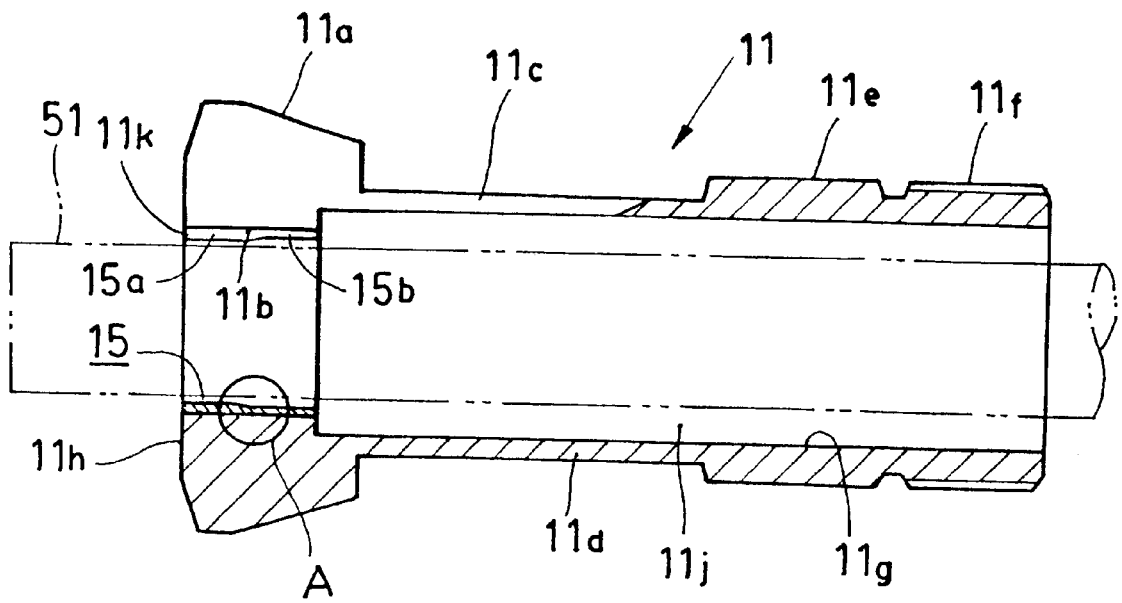
FIG. 1 is a longitudinal sectional view of a guide bush in a preferred embodiment according to the present invention and FIG. 2 is a perspective view of the guide bush of FIG. 1.
Figure 2:
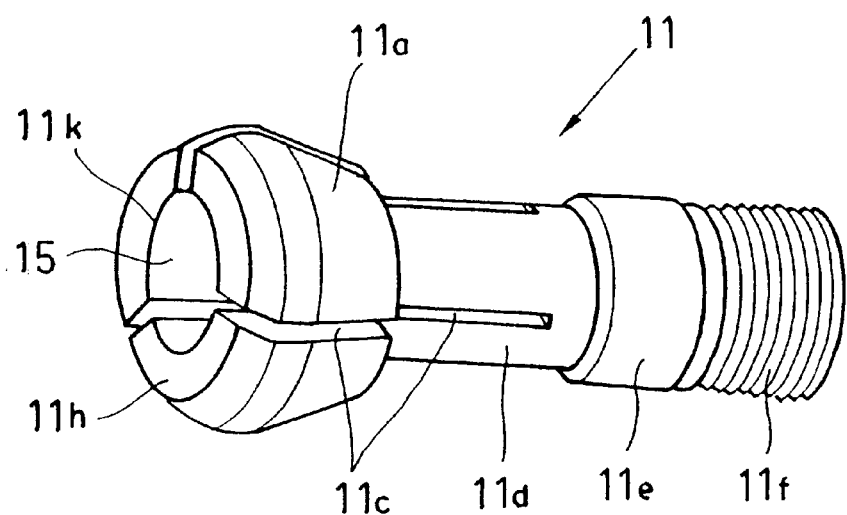

FIGS. 1 and 2 are a longitudinal sectional view and a perspective view, respectively, of a guide bush in a preferred embodiment according to the present invention.

Referring to FIGS. 1 and 2, a guide bush 11 is shown in a free state in which a front end portion is open. The guide bush 11 is formed substantially cylindrical shape and has a center bore 11j in its axial direction, and also has a tapered outer surface 11a in one longitudinal end thereof, a threaded portion 11f in the other longitudinal end thereof.

Further, the center bore 11j of the guide bush 11 has an inner surface 11b for holding a workpiece 51 at the inner side of one end thereof having the outer tapered surface 11a and an expanded section 11g having an inner diameter greater than that of the inner surface 11b.

Three slits 11c are formed at angular intervals of 120° so as to extend through the head portion having the tapered outer surface 11a and an elastic bendable portion 11d.

The clearance between the inner surface 11b and the workpiece 51 indicated by imaginary lines in FIG. 1 can be adjusted by pressing the tapered outer surface 11a of the guide bush 11 by the tapered inner surface of the bush sleeve, so that the elastic bendable portion 11d is bent.

The guide bush 11 has a fitting portion 11e between the elastic bendable portion 11d and the threaded portion 11f. When the guide bush 11 is fitted in the center bore of the bush sleeve 23 (FIGS. 22 and 23), the fitting portion 11e fits the center bore closely to set the guide bush 11 with its axis in alignment with the center axis of the spindle.

The guide bush 11 is made of an alloy tool steel (SKS steel). When forming the guide bush 11, a workpiece of carbon tool steel is machined in predetermined external and internal shapes, and the machined workpiece is subjected to quenching and annealing.

Figure 3:
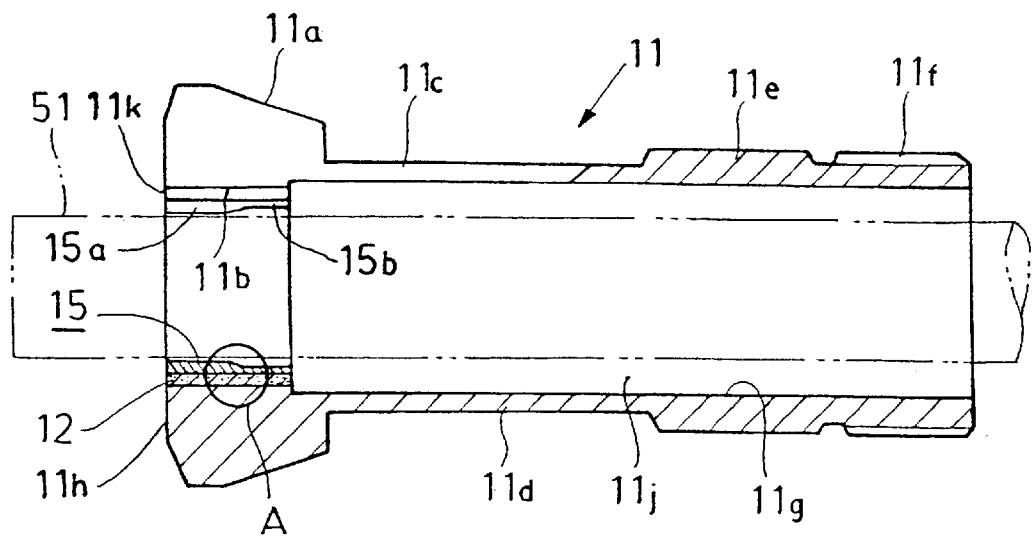
FIG. 3 is a longitudinal sectional view of a guide bush in another embodiment according to the present invention.

Preferably, a superhard lining 12 of a thickness in the range from 2 to 5 mm, is attached to the inner surface 11b of the guide bush 11 as shown in FIG. 3 by brazing. The composition of the superhard lining 12 is composed of 85% to 90% of tungsten (W), 5% to 7% of carbon (C), and 3% to 10% of cobalt (Co) as a binder (an additive metal).

When the head portion having the taper outer surface 11a is compressed, a clearance in the range of 5 to 10 μm is formed between the inner surface 11b and the workpiece 51 in the radial direction thereof to allow the workpiece 51 to slide relative to the guide bush 11, which abrades the inner surface 11b.

When the guide bush 11, as shown in FIG. 22, is used on a stationary guide bush unit, the workpiece 51 supported on the guide bush 11 rotates at a high surface speed relative to the inner surface 11b and, when an excessively high pressure is applied to the inner surface 11b by the workpiece 51, seizing may occur.

Therefore, the inner surface 11b of the guide bush 11 is coated with a hard carbon film (DLC film) 15. Further, the hard carbon film 15 is not formed on the entire inner surface 11b with a uniform thickness, namely, the portion 15a near the open end 11k at the end face 11h side is thicker than the inner portion 15b (which is the portion at the side of the expanded section 11g).

In an example shown in FIG. 1, the hard carbon film 15 is formed on an intermediate layer, which will be described later, formed on the substrate (an alloy tool steel) of the guide bush 11. In an example shown in FIG. 3, the hard carbon film 15 is formed on the superhard lining 12 or on an intermediate layer formed on the superhard lining 12.

The hard carbon film is very similar in properties to diamond; the hard carbon has a high mechanical strength, a small coefficient of friction, a satisfactory self-lubricity, a satisfactory electrical insulation characteristic, a high thermal conductivity and an excellent corrosion resistance.

The hard carbon film 15 covering the inner surface 11b enhances the wear resistance of the guide bush remarkably, the guide bush 11 withstands an extended period of use and heavy machining, the wear of the inner surface 11b in contact with the workpiece 51 is reduced, the possibility of exerting abrasive damage to the workpiece 51 is reduced, and seizing between the guide bush 11 and the workpiece 51 can be avoided.

Further, as set forth above, the hard carbon film on the inner surface 11b of the guide bush 11 is differentiated in thickness in the axial direction thereof so as to make the hard carbon film 15 at the portion 15a near the open end 11k thick, thereby further enhancing the reliability of the guide bush for extended periods of time.

That is, when the guide bush 11 holds the workpiece 51, the workpiece 51 is not held uniformly over the entire region of the inner surface 11b, but is held at a very small region of the inner surface 11b at the end face 11h in terms of the mechanism thereof. A very small gap is defined between the workpiece 51 and the inner surface 11b at the region of the expanded section 11g. Accordingly, the portion near the open end 11k of the inner surface 11b is liable to be more abraded than the inner portion of the inner surface 11b (which is the portion at the side of the expanded section 11g).

So, according to the guide bush of the present invention, the thickness of the hard carbon film 15 formed over the inner surface 11b at the portion 15a near the open end 11k is greater than that at the inner portion 15b. Accordingly, the wear resistance of the guide bush is remarkably improved since the workpiece 51 is held at the portion where the hard carbon film 15 is formed thickly on the inner surface 11b.

As a result, the occurrence of abrasion caused by sliding of the workpiece 51 can be sharply restrained, thereby drastically enhancing the reliability of the guide bush for an extended period of time.

Figure 4:
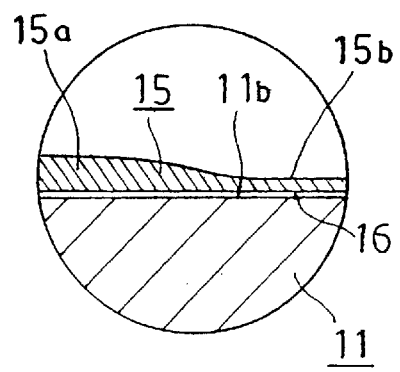
FIGS. 4 to 6 are enlarged sectional views of portions A surrounded by circles in FIGS. 1 and 3.
Figure 5:
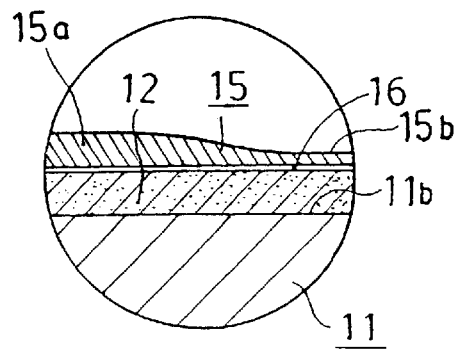
Figure 6:
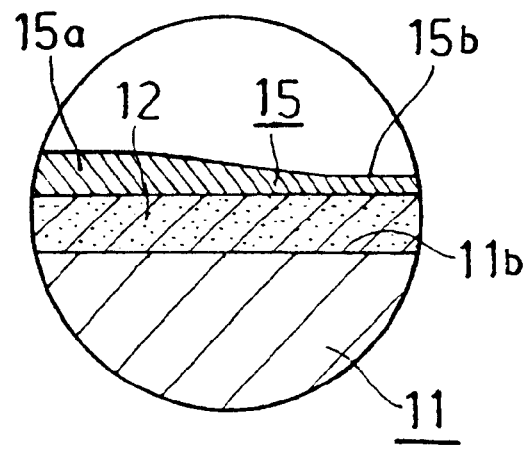

Various structures of layers formed over the inner surface 11b of the guide bush 11 provided with the hard carbon film 15 will be described hereinafter with reference to FIGS. 4 to 6 showing portions A of the surrounded circles in FIGS. 1 and 3 in enlarged sectional view, and FIG. 5 showing a portion of an intermediate layer shown in FIG. 7 in an enlarged view.

Referring to FIG. 4 showing a portion A in FIG. 1 in an enlarged view, a hard carbon film is formed on the intermediate layer 16 which is formed on the substrate of the inner surface 11b of the guide bush 11. The thickness of the hard carbon film at the portion 15a near the open end is 30% to 50% greater than that at the inner portion 15b (in the range of 1 μm to 5 μm). If the substrate of the guide bush 11 permits, the hard carbon film 15 may be formed directly on the inner surface 11b and the intermediate layer 16 may be omitted.

Referring to FIGS. 5 and 6 showing a portion A in FIG. 3 in enlarged views, a superhard lining 12 of a thickness in the range of 2 to 5 mm is attached to the inner surface 11b of the substrate of the guide bush 11 by brazing or the like, and the hard carbon film 15 is formed over the inner surface of the superhard lining 12. This construction further enhances the durability of the guide bush 11.

In the example shown in FIG. 5, an intermediate layer 16 is interposed between the superhard lining 12 and the hard carbon film 15 to further enhance the adhesion.

In these examples, the superhard lining 12 underlying the hard carbon film 15 may be made of a cemented carbide, such as tungsten carbide (WC), or a sintered ceramic material, such as silicon carbide (SiC). Generally, Cr, Ni or Co is added as a binder to a material for producing the sintered ceramic material. The hard carbon film 15 may be formed directly on the superhard lining 12 and the intermediate layer 16 may be omitted when the binder content of the material is small.

A method of making the superhard lining 12 of silicon carbide (SiC) will be described by way of example.

Silicon carbide powder having a silicon (Si) to carbon (C) ratio in atomic percentage of 1 to 1 is molded by pressure molding using a pressure in the range of 0.5 to 3 t in a mold having a ringlike cavity to obtain a ringlike silicon carbide molding. Then, the ringlike silicon carbide molding is baked in an atmosphere of an inert gas, such as argon gas.

The baked molding is heated under pressure at a temperature in the range of 1400 to 1700° C., i.e., a temperature near the melting point of silicon carbide to remove pinholes from the baked silicon carbide molding. The pressure heating process increases the intensity of the baked silicon carbide molding to complete a product as the superhard lining 12 having a Vickers hardness in the range of 2000 to 3000 Hv.

Then, the ringlike superhard lining 12 is coated with a metal film of a material containing titanium (Ti) as a principal component by metallizing. The superhard lining 12 is placed on the inner surface 11b of the guide bush 11, and the guide bush 11 is subjected to a heat treatment process to melt the metal film so that the superhard lining 12 is bonded to the substrate of the guide bush 11.

Then, the inner surface of the superhard lining 12 is ground, and the slits 11c are formed in the guide bush 11.

The intermediate layer 16 may be formed of an element of group IVb in the periodic table of elements, such as silicon (Si) or germanium (Ge), a compound containing silicon or germanium, or a compound containing carbon, such as a silicon carbide (SiC) or titanium carbide (TiC).

The intermediate layer 16 may be formed of a compound of titanium (Ti), tungsten (W), molybdenum (Mo) or tantalum (Ta) and silicon (Si).

Figure 7:
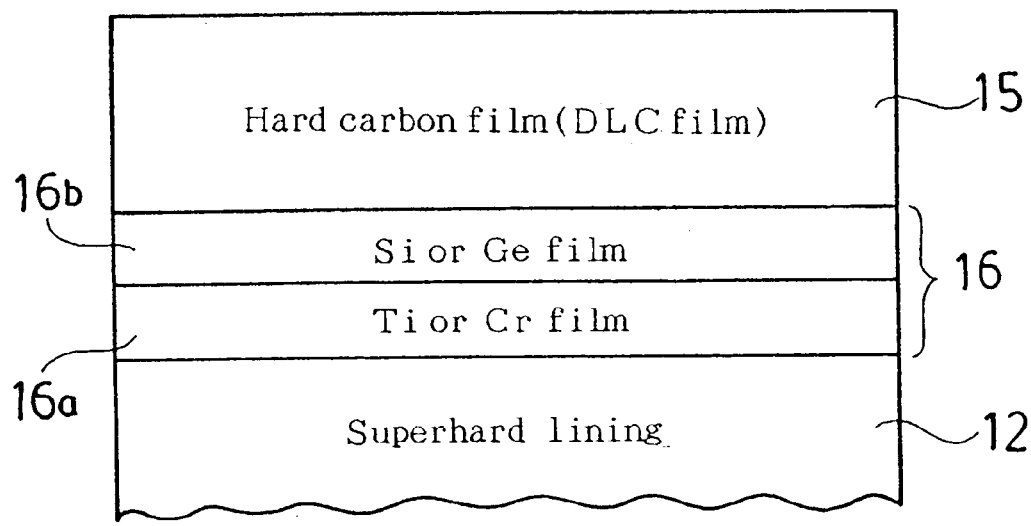
FIG. 7 is a typical enlarged sectional view of a portion of FIG. 5, for assistance in explaining the construction of an intermediate layer.

The intermediate layer 16 may be a two-layer film consisting of a lower layer 16a of titanium (Ti) or chromium (Cr), and an upper layer 16b of silicon (Si) or germanium (Ge) as shown in FIG. 7.

The lower layer 16a of titanium or chromium enhances adhesion to the guide bush 11, and the upper layer 16b of silicon or germanium and the hard carbon film 15 form covalent bond which bonds the hard carbon film 15 firmly to the intermediate layer 16.

The intermediate layer 16 may be: a two-layer film consisting of a lower layer of a titanium or chromium compound, and an upper layer of a silicon or germanium compound; a two-layer film consisting of a lower layer of titanium or chromium, and an upper layer of a silicon or germanium compound; or a two-layer film consisting of a lower layer of titanium or chromium compound and an upper layer of silicon or germanium.

The thickness of these intermediate layers 16 may be 0.5 $\mu$m. However, in case of two-layer film, the thickness of the upper and lower layer may be 0.5 $\mu$m each.

The intermediate layer 16 may be formed by a sputtering process, an ion plating process, a chemical vapor deposition (CVD) process or a metal spraying process.

When the superhard lining 12 is made of silicon carbide (SiC), the intermediate layer 16 may be omitted, because silicon carbide is a compound of silicon and carbon included in group IVb of the periodic table of elements and silicon carbide and the hard carbon film 15 formed on the superhard lining 12 make covalent bonds which secure high adhesion.

Hard Carbon Film Forming Method over an Inner Surface of Guide Bush

A method of forming the hard carbon film over the inner surface of a guide bush, in a preferred embodiment according to the present invention will be described hereinafter.

A hard carbon film forming method will be described as applied to forming the hard carbon film (DLC film) 15 over the inner surface 11b of the guide bush 11 shown in FIG. 3.

The guide bush 11 shown in FIG. 3 is formed by machining a workpiece of an alloy tool steel (SKS steel) and has the tapered outer surface 11a, the elastic bendable portion 11d, the fitting portion 11e, the threaded portion 11f, the center bore 11j, the inner surface 11b formed in a portion of the center bore 11j, and an expanded section 11g of the center bore 11j, having a diameter greater than that of the inner surface 11b. The cylindrical superhard lining 12 is fixedly bonded to the inner surface 11b of the guide bush 11 by brazing.

The slits 11c are formed at angular intervals of 120° so as to extend through the head portion having the tapered outer surface 11a and the elastic bendable portion 11d by electric discharge machining.

The inner surface 11b, the taper outer surface 11a and the fitting portion 11e are ground to complete the guide bush 11 in a stage before forming the hard carbon film thereon.

Figure 8:
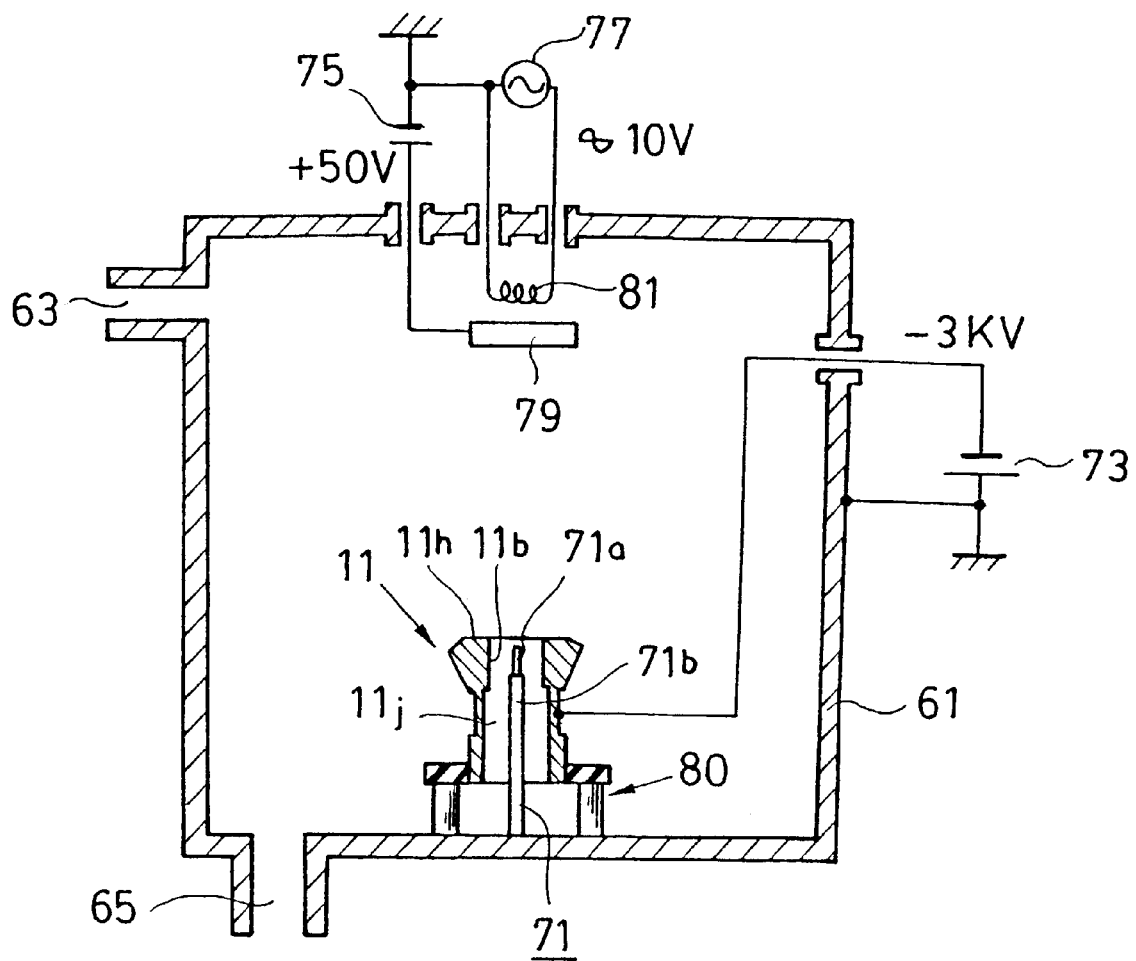
FIG. 8 is a schematic sectional view of a first hard carbon film forming apparatus for carrying out a method of forming a hard carbon film over the inner surface of a guide bush, in accordance with the present invention.

Then, the hard carbon film 15 is formed on the guide bush 11. FIG. 8 shows a first apparatus for forming the hard carbon film 15.

A vacuum vessel 61 is provided with a gas inlet port 63 and an evacuation port 65. An anode 79 and a filament 81 are disposed in the upper central region of the inner space of the vacuum vessel 61. The guide bush 11 is mounted fixedly in an upright position on an insulating support 80 disposed in the lower central region of the inner space of the vacuum vessel 61.

An auxiliary electrode 71 having the shape of a thin rod which is supported by the inner surface of the grounded conductive vacuum vessel 61 is disposed to extend in the center bore 11j of the guide bush 11. At this time, the auxiliary electrode 71 is positioned at the center (substantially coaxially with) of the center bore 11j of the guide bush 11. The auxiliary electrode 71 is maintained at a ground potential via the vacuum vessel 61.

The auxiliary electrode 71 is formed of a metal, such as a stainless steel, and comprises a rodlike stepped portion having an extremity 71a which is smaller (in diameter) than other portion 71b.

The auxiliary electrode 71 is inserted in a manner that the extremity 71a is positioned in the portion near the open end of the inner surface 11b of the guide bush 11. At this time, it is desirable that the extremity 71a of the auxiliary electrode 71 is about 1 mm inside the guide bush 11 not to protrude from the end face 11h thereof.

The vacuum vessel 61 is evacuated to a vacuum of $3\times10^{-5}$ torr by sucking out gases through the evacuation port 65 from the vacuum vessel 61.

Then, benzene gas, i.e., a gas containing carbon, is supplied through the gas inlet port 63 into the vacuum vessel 61 so that the pressure in the vacuum vessel 61 is maintained at a vacuum of $5\times10^{-3}$ torr.

Subsequently, a negative DC voltage is applied to the guide bush 11 by a DC power source 73 and a positive DC voltage is applied to the anode 79 by an anode power source 75, and an AC voltage is applied to the filament 81 by a filament power source 77.

Then, a negative DC voltage of about −3 kV is applied to the guide bush 11 by a DC power source 73 and a positive DC voltage of about 50 V is applied to the anode 79 by an anode power source 75. And an AC voltage of about 10 V is applied to the filament 81 by a filament power source 77 so that a current of 30 A flows through the filament 81.

Thus, a plasma is produced in a region surrounding the guide bush 11 disposed within the vacuum vessel 61 to form a hard carbon film by the plasma CVD method on the surface of the guide bush 11.

At this time, the thickness of the hard carbon film 15 formed over the inner surface 11b of the guide bush 11 is in the range of 1 to 5 $\mu$m at the inner portion 15b at the expanded section 11g side, and the portion 15a near the open end at the end face 11h is 30% to 50% thicker than the inner portion 15b.

In the method of forming the hard carbon film on the inner surface of the guide bush according to the present embodiment, the auxiliary electrode 71 is disposed at the center of the center bore 11j of the guide bush 11 and it is maintained at the ground potential, and the diameter of the auxiliary electrode 71 is varied in the axial direction thereof. That is, in a region where the hard carbon film 15 is intended to be formed thickly on the inner surface 11b of the guide bush 11, the diameter of the extremity 71a of the auxiliary electrode 71 is reduced compared with the other portion 71b so that the gap between the auxiliary electrode 71 and the inner surface 11b is made large.

When the auxiliary electrode 71 is inserted into the center bore 11j of the guide bush 11 as set forth above, a plasma can be produced not only at the outer surface of the guide bush 11 but also in the inner surface thereof. As a result, the same potentials do not confront each other in the center bore 11j. Accordingly, the glow discharge as an abnormal discharge does not occur, thereby enhancing the adhesion of the hard carbon film 15.

At this time, provided that the gap between the inner surface 11b of the guide bush 11 and the auxiliary electrode 71 is not uniform in the axial direction according to the present embodiment, the intensity of plasma produced between the inner surface 11b of the guide bush 11 and the auxiliary electrode 71 is not uniform. That is, the intensity of plasma produced between the inner surface 11b of the guide bush 11 and the auxiliary electrode 71 is higher at the large gap than that at the small gap.

A forming speed of the hard carbon film at the region where the intensity of plasma is high is greater than that at the region where the intensity of plasma is low, and hence the hard carbon film at the portion near open end opposing the extremity 71a of the auxiliary electrode 71 in the inner surface 11b of the guide bush 11 can be thicker than the inner portion opposing the other portion 71b having a large diameter.

Although the auxiliary electrode 71 in this embodiment is formed of a stainless steel, the same may be formed of a metal having a high melting point, such as tungsten (W) or tantalum (Ta). The auxiliary electrode 71 has a circular cross section.

A hard carbon film forming method in another embodiment according to the present invention will be described hereinafter with reference to FIG. 9, in which parts like or corresponding to those shown in FIG. 8 are designated by the same reference characters and the description thereof will be omitted.

A second apparatus for carrying out the hard carbon film forming method has a vacuum vessel 61 and is not, provided with any anode nor any filament.

The hard carbon film forming method using this apparatus differs from that using the apparatus shown in FIG. 8 only in that a radio frequency power of 400 W is applied to a guide bush 11 disposed in the vacuum vessel 61 via a rodlike, grounded, stepped auxiliary electrode 71 extended in the bore thereof through a matching circuit 67 by a radio frequency power source 69 with 13.56 MHz oscillation frequency, and methane gas ($CH_4$) as a gas containing carbon is supplied into the vacuum vessel 61 so that the pressure in the vacuum vessel 61 is maintained at a vacuum of 0.1 torr.

Even in such a manner, the hard carbon film is formed over the inner surface 11b of the guide bush 11 in the range of 1 to 5 μm using the plasma CVD method likewise as in the above-mentioned embodiments, and the portion near the open end is made 30% to 50% thicker than the inner portion.

A hard carbon film forming method in a further embodiment according to the present invention will be described with reference to FIG. 10, in which parts like or corresponding to those shown in FIG. 8 are designated by the same reference characters and the description thereof will be omitted.

A third apparatus for carrying out the hard carbon film forming method has a vacuum vessel 61 and is not provided with any anode and any filament.

The hard carbon film forming method using this apparatus differs from that using the apparatus shown in FIG. 8 only in that a DC voltage of −600 V is applied to a guide bush 11 disposed in the vacuum vessel 61 via a rodlike, grounded, stepped auxiliary electrode 71 extended in the bore thereof by a DC power source 73' and methane gas ($CH_4$) as a gas containing carbon is supplied into the vacuum vessel 61 so that the pressure in the vacuum vessel 61 is maintained at a vacuum of 0.1 torr.

Even in such a manner, the hard carbon film can be formed over the inner surface 11b of the guide bush 11 using the plasma CVD method likewise as in each above-mentioned embodiment.

Although the hard carbon film forming methods described above form the hard carbon film over both the outer and the inner surface of the guide bush 11, the hard carbon film may be formed only over the inner surface of the guide bush 11.

Figure 11:
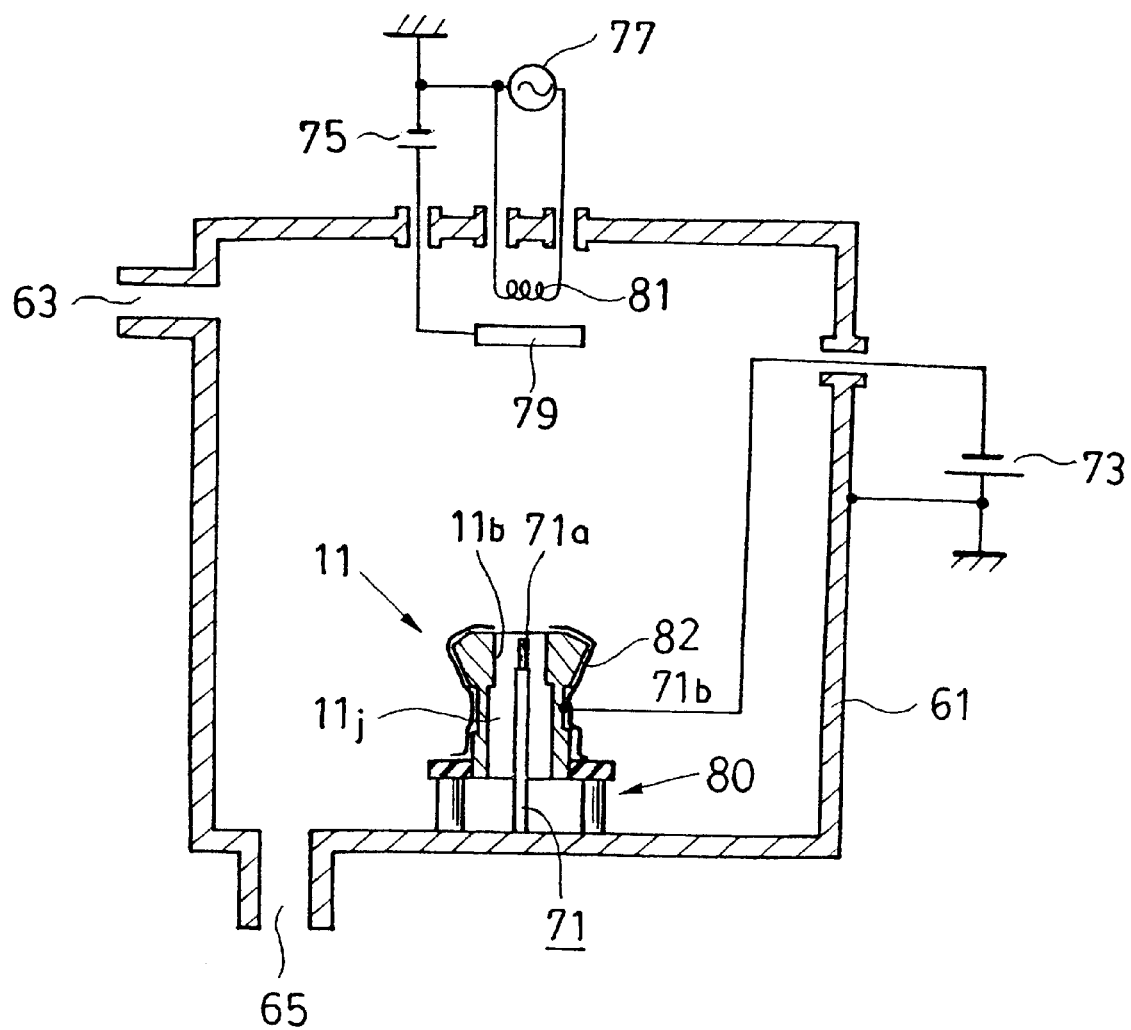
FIG. 11 is a sectional view, similar to FIG. 8, of the hard carbon film forming apparatus of FIG. 7 additionally provided with a covering member.

When it is desired to form the hard carbon film only over the inner surface of the guide bush 11, the outer surface of the guide bush 11 is covered with a covering member 82 as shown in FIG. 11. An aluminum foil may be placed around the outer surface of the guide bush 11 as a simple means for covering the outer surface of the guide bush 11.

FIG. 11 shows the guide bush 11 covered with the covering member 82 disposed in the first apparatus shown in FIG. 8. The hard carbon film having a variable thickness can be firmly formed over only the inner surface by covering the outer surface of the guide bush 11 with the covering member 82, such as an aluminum foil when the second apparatus shown in FIG. 9 or the third apparatus shown in FIG. 10 is used.

These previously described hard carbon film forming methods are applicable to forming the hard carbon film 15 over the inner surface 11b in the foregoing layered structures described with reference to FIGS. 4 to 7.

Although the foregoing hard carbon film forming methods embodying the present invention use methane gas or benzene gas as a gas containing carbon, ethylene containing carbon or a vapor of a liquid containing carbon, such as hexane, may be used instead of methane gas or benzene gas.

Since the foregoing hard carbon film forming method embodying the present invention for forming a hard carbon film on a guide bush disposes the auxiliary electrode at a ground potential in a portion of the bore of the guide bush corresponding to the inner surface 11b over which a hard carbon film is to be formed, the auxiliary electrode at a ground potential can be interposed between the opposite inner surfaces at the same potential. Therefore, the electrodes at the same potential do not face each other and hence hollow cathode discharge, i.e., an abnormal discharge does not occur and hence a satisfactory hard carbon film can be firmly formed over the inner surface 11b of the guide bush 11.

Hard carbon film forming methods in still further embodiments according to the present invention for forming a hard carbon film over the inner surface of a guide bush will be described with reference to FIGS. 12 to 15.

Figure 9:
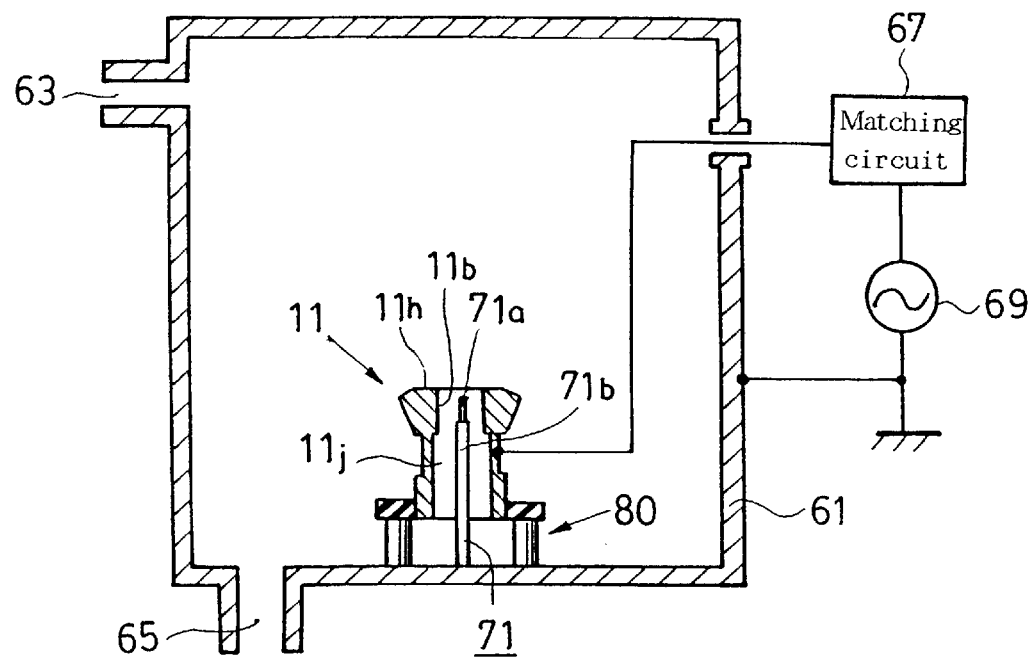
FIG. 9 is a schematic sectional view of a second hard carbon film forming apparatus for carrying out a method of forming a hard carbon film over the inner surface of a guide bush, in accordance with the present invention.
Figure 10:
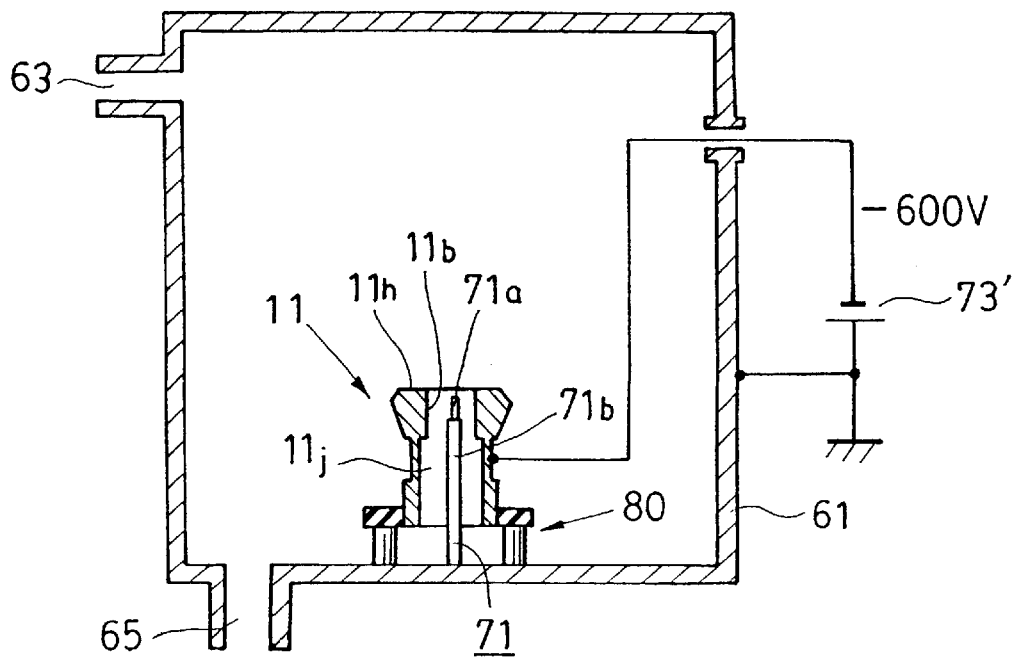
FIG. 10 is a schematic sectional view of a third hard carbon film forming apparatus for carrying out a method of forming a hard carbon film over the inner surface of a guide bush, in accordance with the present invention.
Figure 12:
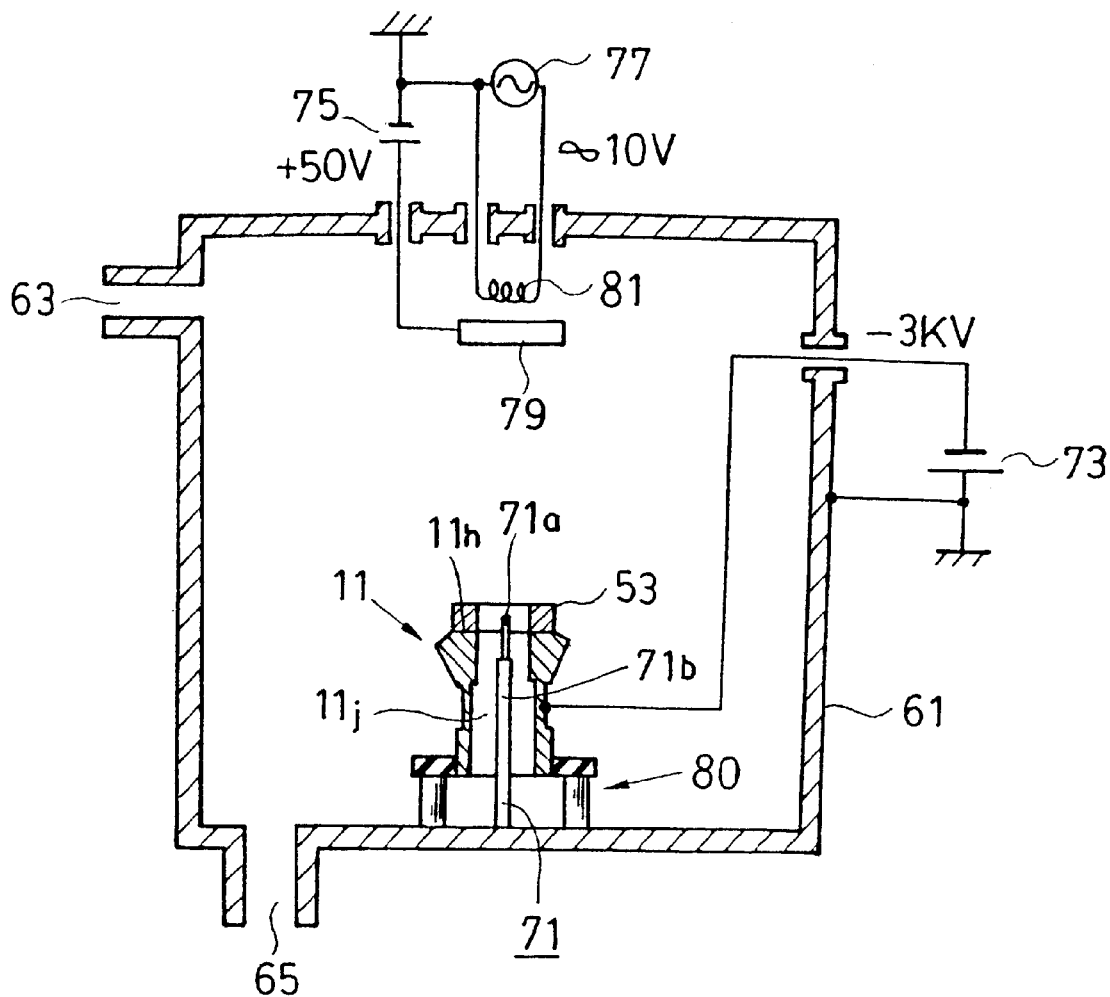
FIG. 12 is schematic sectional view, similar to FIG. 8, of a hard carbon film forming apparatus for carrying out a hard carbon film forming method in another embodiment according to the present invention.
Figure 14:
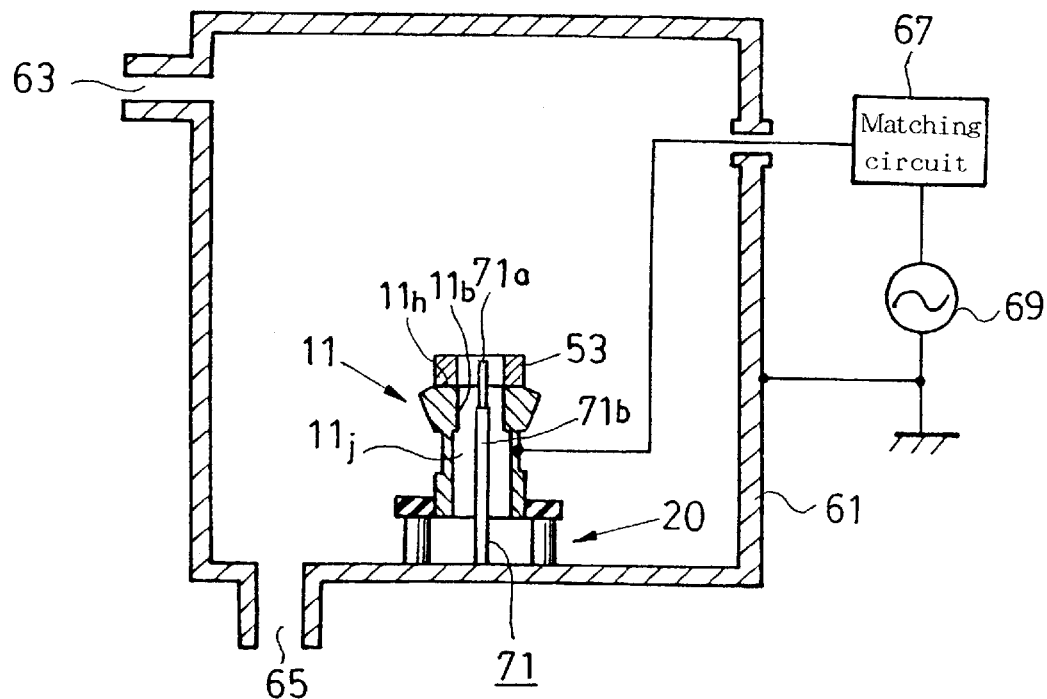
FIGS. 14 and 15 are schematic sectioned views, similar to FIGS. 9 and 10, of hard carbon film forming apparatuses for carrying out a hard carbon film forming method in a further embodiment according to the present invention.
Figure 15:
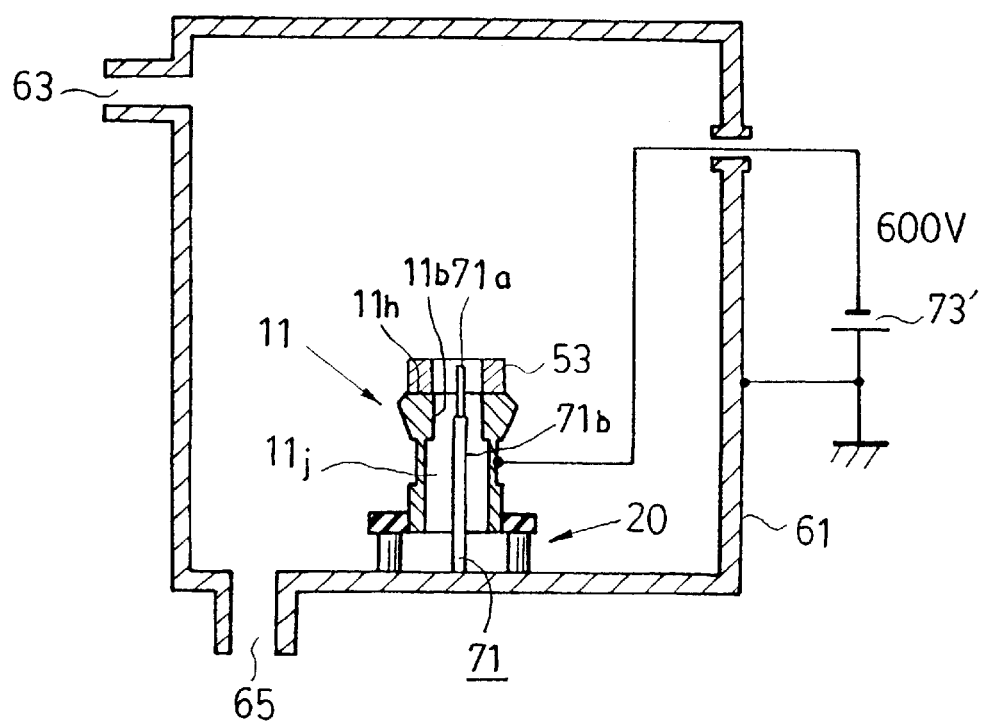

Apparatuses shown in FIGS. 12, 14 and 15 illustrate hard carbon film forming methods using the first, the second and the third apparatus shown in FIGS. 8, 9 and 10, respectively. In FIGS. 12, 14 and 15, parts like or corresponding to those shown in FIGS. 8, 9 and 10 are designated by the same reference characters and the description thereof will be omitted.

Figure 13:
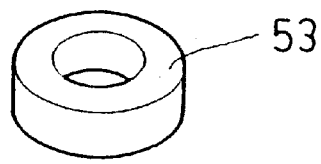
FIG. 13 is a perspective view of a dummy member employed in carrying out the hard carbon film forming method by the hard carbon film forming apparatus of FIG. 12.

These hard carbon film forming methods illustrated in FIGS. 12, 14 and 15 differ from those previously described with reference to FIGS. 8, 9 and 10, respectively, only in that a ringlike dummy member 53 as shown in FIG. 13 having an inside diameter substantially equal to the diameter of the inner surface of 11b of the guide bush 11 (FIG. 1) is employed. The dummy member 53, similarly to the auxiliary electrode 71, is formed of a stainless steel and has an outside diameter substantially equal to the outside diameter of the end surface of the glide bush 11 in which the bore of the guide bush 11 opens.

As shown in FIG. 12, the guide bush 11 on which a hard carbon film is to be formed is disposed in the vacuum vessel 61 having the gas inlet port 63 and the evacuation port 65, and the dummy member 53 is put on the end face 11h on the side of the tapered outer surface of the guide bush 11 (upper end face as viewed in FIG. 12) so that the inner surface of the guide bush 11 and that of the dummy member 53 are aligned.

As mentioned above the superhard lining is fixed to, or the intermediate layer is formed on, the inner surface 11b of the guide bush 11 beforehand.

As mentioned above, the guide bush 11 is disposed in the vacuum vessel 61 with the auxiliary electrode 71 at a ground potential extended in the center bore 11j of the guide bush 11. Preferably, the extremity of the auxiliary electrode 71 does not project from and is slightly below the upper end face of the dummy member 53.

The hard carbon forming method is the same in other respects as that previously described with reference to FIG. 8. To make sure of it, the gases prevailing in the vacuum vessel 61 are sucked out through the evacuation port 65 to evacuate the vacuum vessel 61 to a vacuum of $3 \times 10^{-5}$ torr.

After thus evacuating the vacuum vessel 61, benzene gas ($C_6H_6$) as a gas containing carbon is supplied through the gas inlet port 63 into the vacuum chamber 61 so that the pressure in the vacuum vessel 61 is maintained at a vacuum of $5 \times 10^{-3}$ torr.

A DC voltage of −3 kV is applied to the guide bush 11 by the DC power source 73, a DC voltage of +50 V is applied to the anode 79 by the anode power source 75, and an AC voltage of 10 V is applied to the filament 81 by the filament power source 77 so that a current of 30 A flows through the filament 81.

Consequently, a plasma is produced in a region surrounding the guide bush 11 in the vacuum vessel 61 and a hard carbon film is formed over the surface of the guide bush 11 including the inner surface 11b shown in FIG. 1 of the guide bush 11.

The auxiliary electrode 71 functions as mentioned above, and the dummy member 53 functions as follows.

In this method for forming a hard carbon film on the guide bush 11, the plasma is produced around the inner and the outer surface of the guide bush 11. Electric charges are liable to be concentrated on the end face 11h of the guide bush 11 and the potential of a portion of the guide bush around the end face tends to become higher than that of the inner surface due to an edge effect. Therefore, the intensity of the plasma near the end face 11h of the guide bush 11 is greater than that of the plasma near the guide bush 11 and is unstable.

Furthermore, a portion of the guide bush 11 around the end face 11h is subject to the influence of both the plasma produced outside the guide bush 11 and that produced inside the guide bush 11.

When a hard carbon film is formed under such conditions, the adhesion and quality of a portion of the hard carbon film formed on a portion of the inner surface in a range of several millimeters from the end face 11h of the guide bush differ slightly from those of a portion of the same formed on other portions of the inner surface of the guide bush 11.

When the dummy member 53 is put on the end face 11h of the guide bush 11 as shown in FIG. 12 during the hard carbon film forming process, the portion of the hard carbon film having adhesion and quality different from those of a portion of the same formed on other portions of the inner surface of the guide bush 11 is not formed over the inner surface of the guide bush 11 and is formed over the inner surface of the dummy member 53.

Experiments showed that a hard carbon film of a width in the range of 1 to 2 mm having adhesion and quality slightly different from those of a hard carbon film formed in other portions of the inner surface of the guide bush 11 was formed at a depth of about 4 mm from the end face of the guide bush 11 when the hard carbon film was formed by the hard carbon film forming method illustrated in FIG. 8.

As shown in FIG. 12, when the dummy member 53 of 10 mm in length and an inside diameter substantially equal to that of the bore of the guide bush 11 was put on the end face 11h of the guide bush 11 and the hard carbon film forming method was carried out under the foregoing conditions, a portion of the hard carbon film having adhesion and quality different from other portions of the hard carbon film was formed on the dummy member 53 and any such portion was not formed over the inner surface of the guide bush 11 at all.

The hard carbon film forming method illustrated in FIG. 14, similarly to the hard carbon film forming method illustrated in FIG. 9, is different from the aforesaid method only in that a radio frequency power of 400 W is applied through the matching circuit 67 by the radio frequency power source 69 of 13.56 MHz in oscillation frequency to produce a plasma in the vacuum vessel 61, and methane gas ($CH_4$) as a gas containing carbon is supplied into the vacuum vessel 61 so that the pressure in the vacuum vessel 61 is maintained at a vacuum of 0.1 torr.

The hard carbon film forming method illustrated in FIG. 15 is different from the aforesaid method only in that a DC voltage of −600 V is applied to the guide bush 11 by the DC power source 73' to produce a plasma in the vacuum vessel 61.

These methods are able to form efficiently a hard carbon film having uniform adhesion and quality with a prescribed thickness can be formed over the inner surface 11b of the guide bush 11 by using the auxiliary electrode 71 and the dummy member 53.

The hard carbon film can be formed only over the inner surface of the guide bush 11 by covering the outer surface of the guide bush with the covering member 82 as shown in FIG. 14.

When carrying out those hard carbon forming methods, the auxiliary electrode 71 is disposed so that its extremity is about 1 mm inside the dummy member 53 from the end face of the dummy member 53. Therefore abnormal discharge at the extremity of the auxiliary electrode 71 that occurs when the extremity of the auxiliary electrode 71 projects from the end face of the dummy member 53 can be avoided and the hard carbon film 15 can be formed in a satisfactory quality on the inner surface 11b of the guide bush 11.

Hard carbon film forming methods in further preferred embodiments according to the present invention for forming a hard carbon film on a guide bush will be described with reference to FIGS. 16 to 20.

Figure 16:
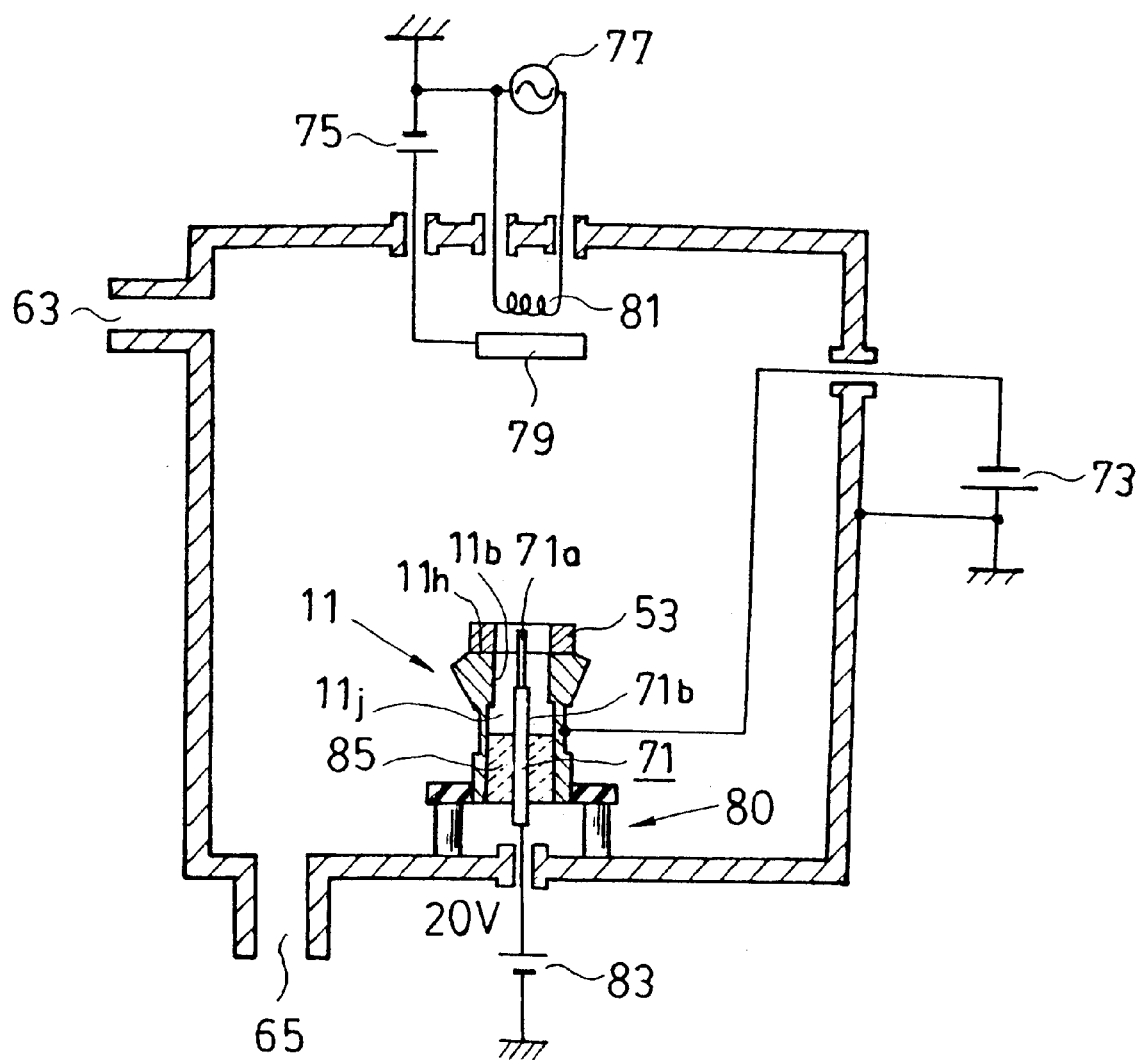
FIG. 16 is a schematic sectional view similar to FIG. 12, of a hard carbon film forming apparatus for carrying out a hard carbon film forming method in still a further embodiment according to the present invention.
Figure 17:
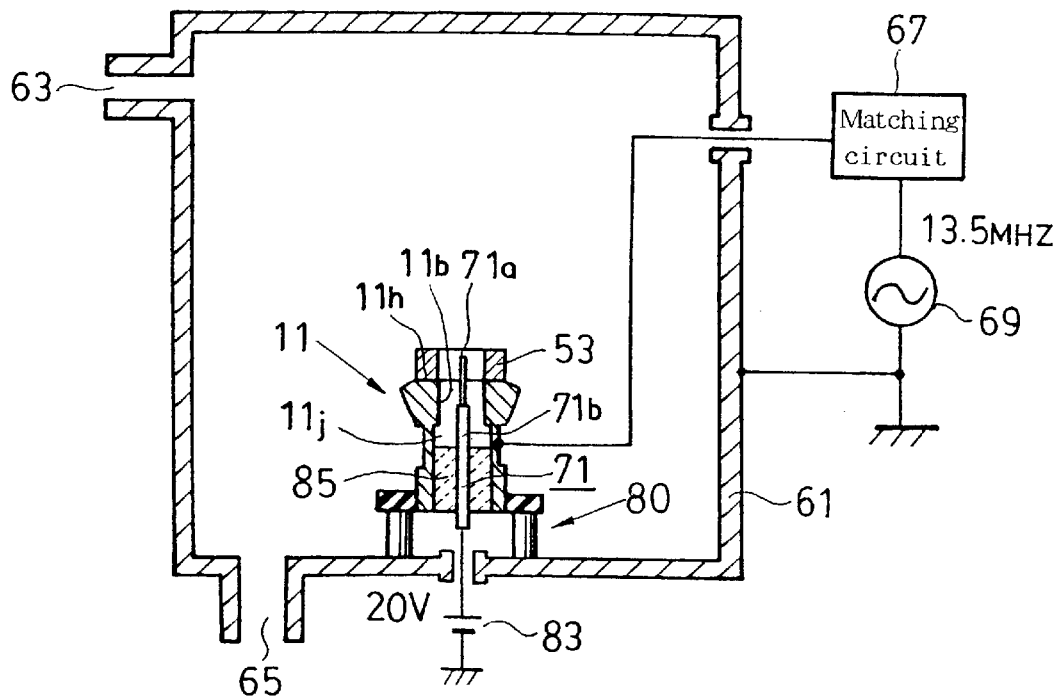
FIGS. 17 and 18 are schematic sectional views, similar to FIGS. 14 and 15, of hard carbon film forming apparatuses for carrying out a hard carbon film forming method in a preferred embodiment according to the present invention.
Figure 18:
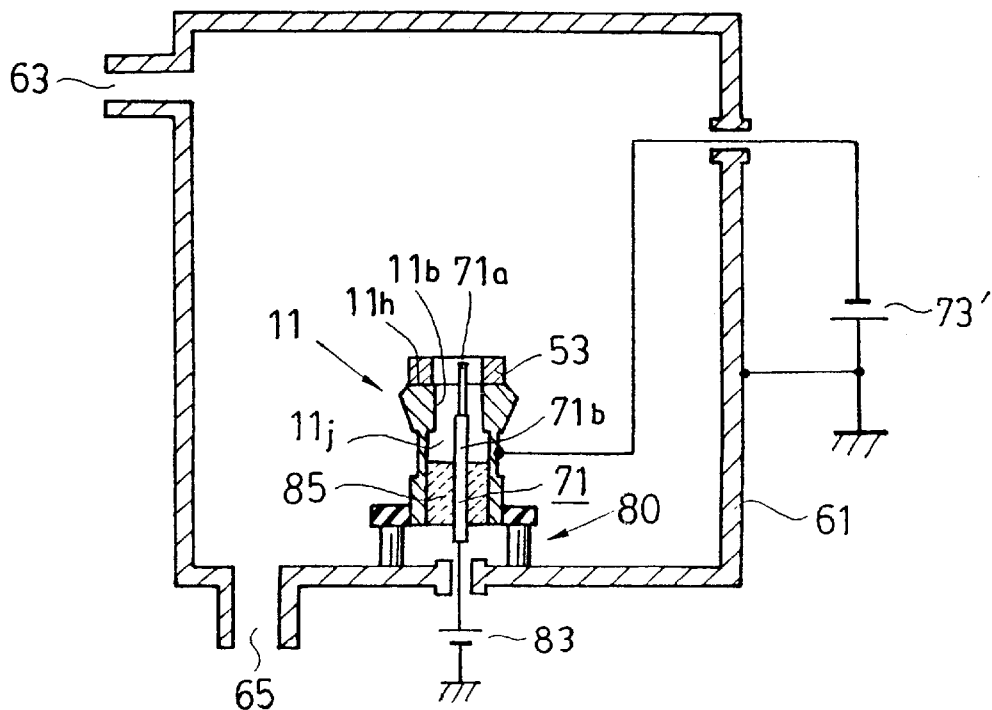

FIGS. 16 to 18 illustrate the hard carbon film forming methods, respectively. FIGS. 16 to 18 correspond to FIGS. 12, 14 and 15, respectively. In FIGS. 16 to 18, parts like or corresponding to those shown in FIGS. 12, 14 and 15 are designated by the same reference characters and the description thereof will be omitted.

These hard carbon film forming methods are different from the foregoing hard carbon film forming methods in that the auxiliary electrode 71 is supported on an insulator 85 received in the center bore 11j of a guide bush 11 so that the auxiliary electrode 71 is insulated from both the guide bush 11 and the vacuum vessel 61, and a positive DC voltage of, for example, 20 V is applied to the auxiliary electrode 71 by an auxiliary electrode power source 83.

Figure 19:
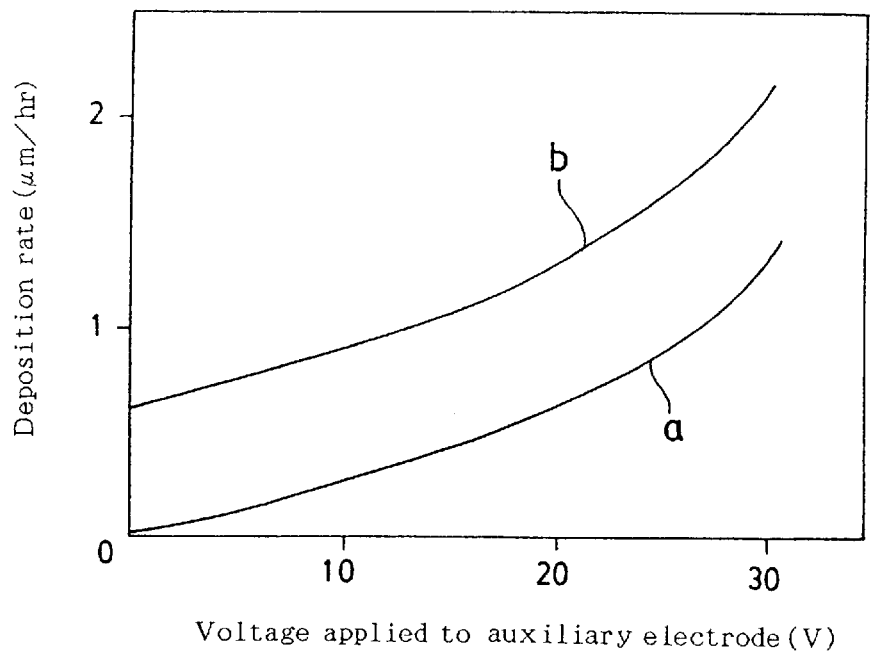
FIG. 19 is a graph showing the dependence of the thickness of a hard carbon film on DC positive voltage applied to an auxiliary electrode.

FIG. 19 shows the dependence of the thickness of a hard carbon film formed over the inner surface of the guide bush 11 on the positive voltage applied to the auxiliary electrode 71.

In FIG. 19, the thickness of the hard carbon film is shown when the clearance between the inner surface of the glide bush 11 and the auxiliary electrode 71 is 3 mm and 5 mm while the positive DC voltage applied to the auxiliary electrode 71 was varied from 0 V to 30 V. Characteristic curves a and b are for the clearance of 3 mm and 5 mm, respectively.

It is known from the curves a and b that the rate of deposition of the hard carbon film increases as the positive DC voltage applied to the auxiliary electrode 71 increases and the rate of deposition of the hard carbon film is higher when the clearance between the inner surface of the bore of the guide bush 11 and the auxiliary electrode 11 is greater.

Accordingly, the hard carbon film is formed thick at the region opposing the thin extremity 71a of the auxiliary electrode 71 in the inner surface 11b of the guide bush 11.

No plasma is produced around the inner surface of the center bore 11j of the guide bush 11 nor can any hard carbon film be formed when a voltage of 0 V is applied to the auxiliary electrode 71 and the potential of the auxiliary electrode 71 is equal to the ground voltage and the clearance between the inner surface of the bore of the guide bush and the auxiliary electrode 71 is 3 mm (curve a).

A plasma is produced around the auxiliary electrode 71 within the center bore 11j of the guide bush 11 and a hard carbon film can be formed when the positive DC voltage applied to the auxiliary electrode 71 is increased even when the clearance between the inner surface of the center bore 11j and the auxiliary electrode 71 is 3 mm.

Therefore, this hard carbon film forming method that applies a positive DC voltage to the auxiliary electrode 71 is able to form a hard carbon film over the inner surface of a guide bush having a center bore 11j of a small diameter.

All the hard carbon film forming methods illustrated in FIGS. 16 to 18 have the same effect.

As described with reference to FIGS. 8 to 10, the same effect can be obtained by applying a positive DC voltage to the auxiliary electrode 71 when forming a hard carbon film without using the dummy member 53.

Figure 20:
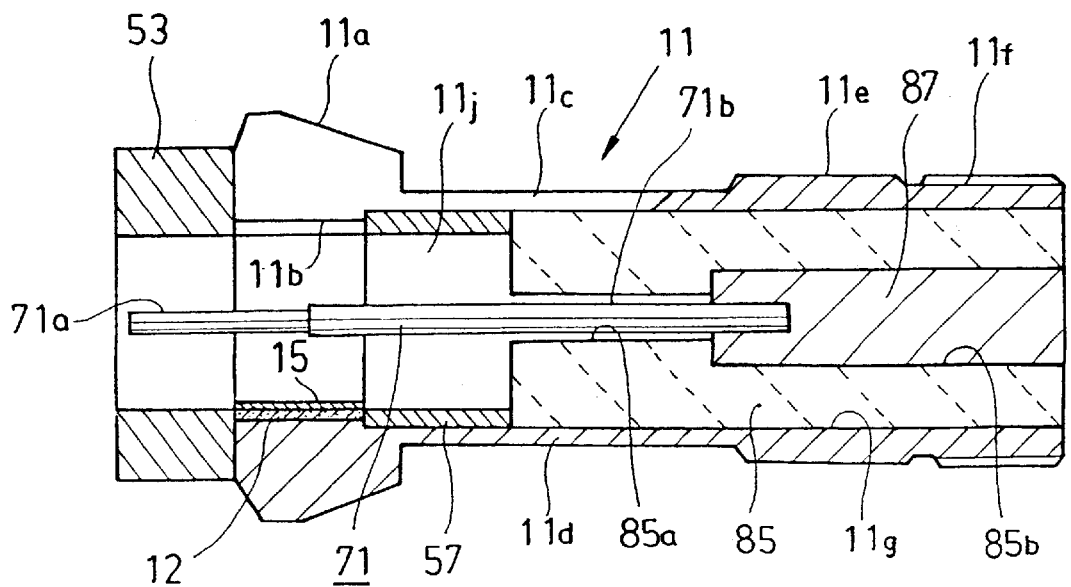
FIG. 20 is a sectional view of a concrete example of an auxiliary electrode support structure.

FIG. 20 shows a concrete example of a structure for supporting the auxiliary electrode 71 in the center bore of the guide bush 11 in an insulated state.

As shown in FIG. 20, an insulator 85 made of an insulating ceramic material is inserted in the expanded section 11g of the center bore of the guide bush 11 provided with a first center bore 85a and a second center bore 85b of a diameter different from that of the first center bore 85a.

The auxiliary electrode 71 is inserted in the first center bore 85a, and a connecting electrode 87 having a comparatively large diameter and joined to the auxiliary electrode 71 is fitted in the second center bore 85b. The auxiliary electrode 71 is formed of a metal such as a stainless steel, and is formed in the shape of a stepped rod and comprises an extremity 71a and an other portion 71b wherein the former is smaller than the latter.

The large diameter portions 71b of the auxiliary electrode 71 and the first center bore 85a are respectively determined so that a clearance in the range of 0.01 to 0.03 mm is formed between the respective surfaces of the auxiliary electrode 71 and the first center bore 85a.

The respective diameters of the expanded section 11g of the guide bush 11 and the insulator 85 are determined so that a clearance in the range of 0.01 to 0.03 mm is formed between the respective surfaces of the expanded section 11g of the guide bush 11 and the insulator 85.

A cylindrical jig 57 is disposed near the inner surface 11b of the guide bush 11. The inside diameter of the cylindrical jig 57 is approximately equal to the diameter of the inner surface 11b.

When the cylindrical jig 57 is held between the insulator 85 and the inner surface 11b of the guide bush 11, and the dummy member 53 is mounted on the end face of the guide bush 11, no step is formed near the inner surface 11b of the guide bush 11 on which the hard carbon film 15 is formed. That is, the gap between the portion near the inner surface 11b forming the hard carbon film 15 and the auxiliary electrode 71 is determined by the diameter of the auxiliary electrode 71, and the gap between the portion near the inner surface 11b and the extremity 71a is made large.

The auxiliary electrode 71 can be disposed in the center bore 11j of the guide bush 11 in accurate alignment with the center axis of the center bore 11j by inserting the insulator 85 supporting the auxiliary electrode 71 in the expanded section 11g of the guide bush 11.

If the auxiliary electrode 71 is out of alignment with the center axis of the center bore of the guide bush 11, an unbalanced plasma is produced in the space between the auxiliary electrode 71 and the surface of the center bore and, consequently, the hard carbon film 15 cannot be formed in a uniform thickness and a uniform quality.

The auxiliary electrode 71 can be disposed in accurate alignment with the center axis of the center bore of the guide bush 11 and the hard carbon film 15 can be formed in a uniform thickness and a uniform quality by determining the diameter of the insulator 85 so that the insulator 85 can be closely fitted in the expanded section 11g of the center bore of the guide bush 11 and adjusting the position of the auxiliary electrode 71 by the first center bore 85a of the insulator 85.

A positive DC voltage is applied through the connecting electrode 87 to the auxiliary electrode 71 when carrying out the hard carbon film forming methods previously described with reference to FIGS. 16 to 18. Since the auxiliary electrode 71 collets electrons, a plasma of a high intensity is formed in the center bore 11j of the guide bush 11, which enhances the rate of deposition of the hard carbon film by a plasma CVD method.

The auxiliary electrode 71 is connected through the connecting electrode 87 to a ground potential when carrying out the hard carbon film forming methods previously described with reference to FIGS. 8 to 15.

A negative voltage lower than that applied to the guide bush 11 (a negative voltage about 1/10 times the voltage applied to the guide bush 11) may be applied to the auxiliary electrode 71. When such a negative voltage is applied to the auxiliary electrode 71, then motion of electrons within the center bore 11j of the guide bush 11 is intensified, whereby the intensity of the plasma is increased and hence the rate of deposition of the hard carbon film is enhanced.

The insulated auxiliary electrode 71 may be maintained at a floating potential. When the auxiliary electrode 71 is at a floating potential, a negative potential is produced on the auxiliary electrode 71 by the interaction between the plasma and the auxiliary electrode 71, the effect of which is equivalent to that of the application a low negative voltage to the auxiliary electrode 71.

Figure 21:
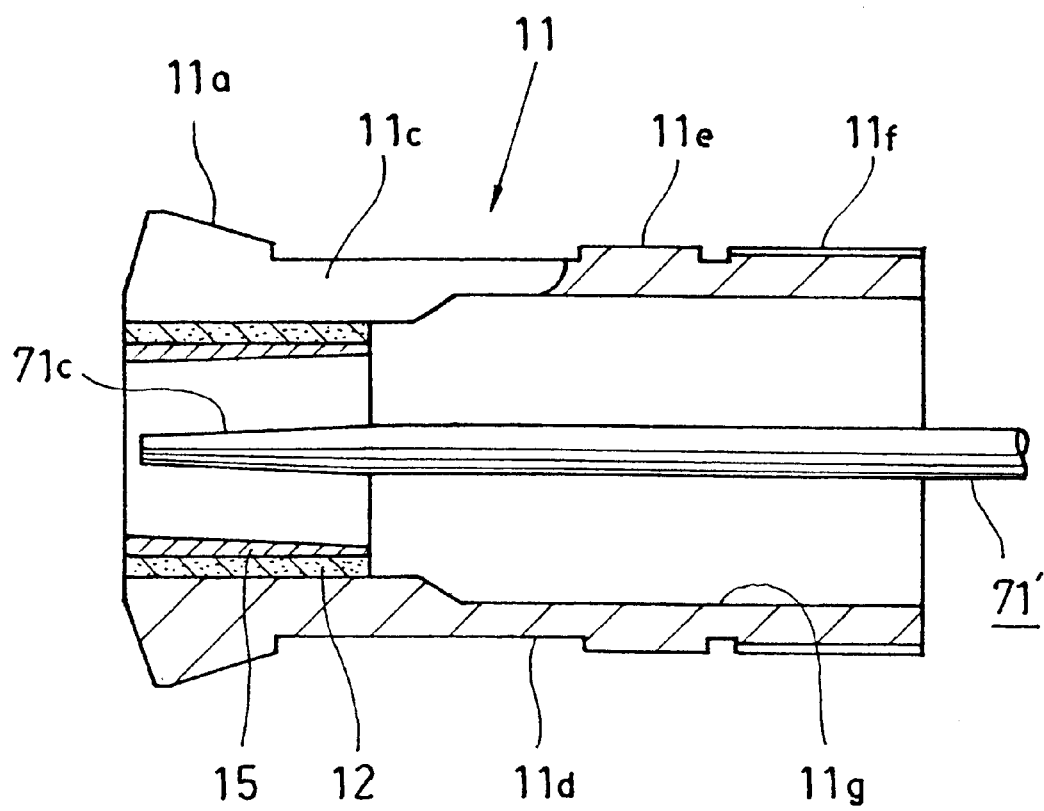
FIG. 21 is a sectional view showing a state where an auxiliary electrode of another shape is inserted into the center bore of the guide bush.

Another example of the shape of an auxiliary electrode which is used when forming the hard carbon film on the inner surface of the guide bush is illustrated in FIG. 21.

The auxiliary electrode 71' has a shape of a rod having a taper part 71c at the extremity, and it is formed of a metal such as a stainless steel likewise as in the auxiliary electrode 71 as set forth above. The difference between the maximum diameter and the minimum diameter of the taper part 71c is about 1 mm.

In each embodiment set forth above, even if the hard carbon film is formed using the auxiliary electrode 71' shown in FIG. 21 instead of the auxiliary electrode 71, the same effects as those of the above-mentioned embodiments can be achieved.

That is, the hard carbon film can be firmly formed over the inner surface 11b of the guide bush 11 with uniform quality, and the thickness of the hard carbon film can be greater at the portion near the open end than that at the inside thereof. In the case where the auxiliary electrode 71' is used, the thickness of film can be gradually, continuously varied.

Although the foregoing hard carbon film forming methods embodying the present invention have been described as applied to forming the hard carbon film 15 on the surface of the superhard lining 12, those hard carbon film forming methods may be applied to forming the hard carbon film 15 directly on the inner surface 11b of the guide bush 11 not provided with the superhard lining 12, forming the hard carbon film 15 on the intermediate layer 16 formed over the inner surface 11b of the guide bush 11, or forming the hard carbon film 15 on the intermediate layer 16 formed on the surface of the superhard lining 12 attached to the inner surface 11b of the guide bush 11.

Although the foregoing hard carbon film forming methods embodying the present invention use methane ($CH_4$) gas or benzene ($C_6H_6$) gas as a gas containing carbon, the hard carbon film forming methods may use ethylene ($C_2H_4$), hexane ($C_6H_{14}$) or the like.

These gases containing carbon may be diluted by an inert gas that is ionized at a relatively low ionization potential, such as argon (Ar) to stabilize the plasma produced in the center bore of the guide bush.

A small amount of an additive (1% or less) may be added to the gas containing carbon for forming the hard carbon film to enhance lubricity or hardness.

Addition of, for example, fluorine (F) or boron (B) to the gas containing carbon increases lubricity. Addition of, for example, chromium (Cr), molybdenum (Mo) or tungsten (W) to the gas containing carbon increases hardness.

It is desirable to produce a plasma of argon (Ar) or nitrogen ($N_2$) after placing the guide bush in the vacuum vessel prior to forming the hard carbon film to bombard the inner surface of the guide bush, and to produce a plasma of the gas containing carbon, such as methane gas or benzene gas, for forming the hard carbon film.

This pretreatment using bombardment with an inert gas increases the temperature of the inner surface of the guide bush, activates the inner surface and drives out impurities from the inner surface of the guide bush to clean the inner surface. These effects further improve the adhesion of the hard carbon film formed over the inner surface of the guide bush by the plasma CVD method.

As is apparent from the foregoing description, the use of the guide bush of the present invention on the rotary or the stationary guide bush device of an automatic lathe enables the automatic lathe to carry out the normal machining of a workpiece at an increased depth of cut without damaging the workpiece or causing seizure between the guide bush and the workpiece, and enhances the machining efficiency of the automatic lathe remarkably. The remarkably enhanced durability of the guide bush extends time for which machining can be continued, which increases the operation rate of the automatic lathe remarkably. When the guide bush is incorporated into the stationary guide bush device of an automatic lathe, the automatic lathe is able to achieve precision machining (particularly in roundness) efficiently.

The hard carbon film forming method for forming a hard carbon film on the inner surface of a guide bush is capable of forming a hard carbon film (DLC film) having greater thickness at the portion near the open end than that at the inside thereof, closely similar to those of diamond over the inner surface of a guide bush that is brought into sliding contact with a workpiece in a high adhesion in a short time.

Thus, the hard carbon film forming method is capable of manufacturing a durable guide bush for use on the guide bush device of an automatic lathe at a high productivity.

What is claimed is:

1. A method of forming a hydrogenated amorphous carbon (DLC) film over an inner surface of a guide bush which is formed substantially in a cylindrical shape and has a center bore through a longitudinal axis thereof, and further includes a tapered outer surface, an inner surface to be in sliding contact with a workpiece and slits provided at one end thereof, and which inner surface holds the workpiece inserted into the center bore rotatably and slidably in the direction of said longitudinal axis near a cutting tool when the guide bush is mounted on an automatic lathe, comprising:

disposing the guide bush in a vacuum vessel provided with a gas inlet port and an evacuation port;

inserting an electrode, provided with a stepped portion and having an extremity which is smaller than another portion of the electrode, into the center sore forming the inner surface of the guide bush in such a manner that the extremity is positioned near an open end of the inner surface of the guide bush, and the electrode is maintained at a ground potential;

introducing a gas, containing carbon, through the gas inlet port into the vacuum vessel after evacuating the vacuum vessel; and producing a plasma in the vacuum vessel to form the carbon film of hydrogenated amorphous carbon over the inner surface of the guide bush by a plasma CVD method.

2. A method of forming a hard carbon film over the inner surface of a guide bush according to claim 1, wherein the vacuum vessel is provided with an anode and a filament so as to produce the plasma in the vacuum vessel by applying a DC voltage to the guide bush, a DC voltage to the anode, and an AC voltage to the filament.

3. A method of forming a hydrogenated amorphous carbon (DLC) film over the inner surface of a guide bush according to claim 1, wherein the plasma is produced in the vacuum vessel by applying radio frequency power to the guide bush.

4. A method of forming a hydrogenated amorphous carbon (DLC) film over the inner surface of a guide bush according to claim 1, wherein
the plasma is produced in the vacuum vessel by applying a DC voltage to the guide bush.

5. A method of forming a hydrogenated amorphous carbon (DLC) film over an inner surface of a guide bush which is formed substantially in a cylindrical shape and has a center bore through a longitudinal axis thereof, and further includes a tapered outer surface, an inner surface to be in sliding contact with a workpiece and slits provided at one end thereof, and which inner surface holds the workpiece inserted into the center bore rotatably and slidably in the direction of said longitudinal axis near a cutting tool when the guide bush is mounted on an automatic lathe, comprising:
disposing the guide bush in a vacuum vessel provided with a gas inlet port and an evacuation port;
inserting an electrode, provided with a stepped portion and having an extremity which is smaller than another portion of the electrode, into the center bore forming the inner surface of the guide bush in such a manner that the extremity is positioned near an open end of the inner surface of the guide bush, and applying a positive current to the electrode;
introducing a gas, containing carbon, through the gas inlet port into the vacuum vessel after evacuating the vacuum vessel; and
producing a plasma in the vacuum vessel to form the carbon film of hydrogenated amorphous carbon over the inner surface of the guide bush by a plasma CVD method.

6. A method of forming a hydrogenated amorphous carbon (DLC) film over the inner surface of a guide bush according to claim 9, wherein
the vacuum vessel is provided with an anode and a filament so as to produce a plasma in the vacuum vessel by applying a DC voltage to the guide bush, a DC voltage to the anode, and an AC voltage to the filament.

7. A method of forming a hydrogenated amorphous carbon (DLC) film over the inner surface of a guide bush according to claim 5, wherein the plasma is produced in the vacuum vessel by applying radio frequency power to the guide bush.

8. A method of forming a hard carbon film over the inner surface of a guide bush according to claim 5, wherein
the plasma is produced in the vacuum vessel by applying a DC voltage to the guide bush.

9. A method of forming a hydrogenated amorphous carbon (DLC) film over an inner surface of a guide bush which is formed substantially in a cylindrical shape and has a center bore through a longitudinal axis thereof, and further includes a tapered outer surface, an inner surface to be in sliding contact with a workpiece and slits provided at one end thereof, and which inner surface holds the workpiece inserted into the center bore rotatably and slidably in the direction of said longitudinal axis near a cutting tool when the guide bush is mounted on an automatic lathe, comprising;
disposing the guide bush in a vacuum vessel provided with a gas inlet port and an evacuation port;
inserting an electrode, provided with a tapered portion and having an extremity, into the center bore forming the inner surface of the guide bush in such a manner that the extremity of the tapered portion is positioned near an open end of the inner surface of the guide bush, and the electrode is maintained at a around potential;
introducing, a gas, containing carbon, through the gas inlet port into the vacuum vessel after evacuating the vacuum vessel; and
producing a plasma in the vacuum vessel to form the carbon film of hydrogenated amorphous carbon over the inner surface of the guide bush by a plasma CVD method.

10. A method of forming a hydrogenated amorphous carbon (DLC) film over the inner surface of a guide bush according to claim 9, wherein
the vacuum vessel is provided with an anode and a filament so as to produce a plasma in the vacuum vessel by applying a DC voltage to the guide bush, a DC voltage to the anode, and an AC voltage to the filament.

11. A method of forming a hydrogenated amorphous carbon (DLC) film over the inner surface of a guide bush according to claim 9, wherein
the plasma is produced in the vacuum vessel by applying radio frequency power to the guide bush.

12. A method of forming a hydrogenated amorphous carbon (DLC) film over the inner surface of a guide bush according to claim 9, wherein
the plasma is produced in the vacuum vessel by applying a DC voltage to the guide bush.

13. A method of forming a hydrogenated amorphous carbon (DLC) film over an inner surface of a guide bush which is formed substantially in a cylindrical shape and has a center bore through a longitudinal axis thereof, and further includes a tapered outer surface, an inner surface to be in sliding contact with a workpiece and slits provided at one end thereof, and which inner surface holds the workpiece inserted into the center bore rotatably and slidably in the direction of said longitudinal axis near a cutting tool when the guide bush is mounted on an automatic lathe, comprising:
disposing the guide bush in a vacuum vessel provided with a gas inlet port and an evacuation port;
inserting an electrode, provided with a tapered portion and having an extremity, into the center bore forming the inner surface of the guide bush in such a manner that the extremity of the tapered portion is positioned near an open end of the inner surface of the guide bush, and applying a positive DC current to the electrode;
introducing a gas, containing carbon, through the gas inlet port into the vacuum vessel after evacuating the vacuum vessel; and
producing a plasma in the vacuum vessel to form the carbon film of hydrogenated amorphous carbon over the inner surface, of the guide bush by a plasma CVD method.

14. A method of forming a hydrogenated amorphous carbon (DLC) film over the inner surface of a guide bush according to claim 13, wherein
the vacuum vessel is provided with an anode and a filament so as to produce the plasma in the vacuum vessel by applying a DC voltage to the guide bush, a DC voltage to the anode, and an AC voltage to the filament.

15. A method of forming a hydrogenated amorphous carbon (DLC) film over the inner surface of a guide bush according to claim 13, wherein
the plasma is produced in the vacuum vessel by applying radio frequency power to the guide bush.

16. A method of forming a hydrogenated amorphous carbon (DLC) film over the inner surface of a guide bush according to claim 13, wherein
the plasma is produced in the vacuum vessel by applying a DC voltage to the guide bush.

* * * * *

UNITED STATES PATENT AND TRADEMARK OFFICE
CERTIFICATE OF CORRECTION

PATENT NO.: 6,096,390
DATED : August 1, 2000
INVENTOR(S): Koike et al.

It is certified that error appears in the above-identified patent and that said Letters Patent is hereby corrected as shown below:

Column 18, line 46: change "sore" to read --bore--;
           line 58: change "hard carbon" to read --hydrogenated amorphous carbon (DLC)--

Column 19, line 35: change "9" to read --5--;
           line 45: change "hard carbon" to read --hydrogenated amorphous carbon (DLC)--
           line 59: change ";" to read --:--
           line 67: change "around" to read --ground--
           line 68: after the word "introducing" delete the ",".

Column 20, line 46: after the word "surface" delete ",".

Signed and Sealed this

Seventeenth Day of April, 2001

*Attest:*

NICHOLAS P. GODICI

*Attesting Officer*      *Acting Director of the United States Patent and Trademark Office*